(12) United States Patent
Maki

(10) Patent No.: US 10,575,400 B2
(45) Date of Patent: Feb. 25, 2020

(54) LIGHT-EMITTING MODULE

(71) Applicant: TOSHIBA HOKUTO ELECTRONICS CORPORATION, Asahikawa-shi (JP)

(72) Inventor: Keiichi Maki, Suita (JP)

(73) Assignee: Toshiba Hokuto Electronics Corporation, Asahikawa-Shi (JP)

( * ) Notice: Subject to any disclaimer, the term of this patent is extended or adjusted under 35 U.S.C. 154(b) by 12 days.

(21) Appl. No.: 15/795,774

(22) Filed: Oct. 27, 2017

(65) Prior Publication Data

US 2018/0049318 A1 Feb. 15, 2018

Related U.S. Application Data

(63) Continuation of application No. PCT/JP2016/002237, filed on Apr. 28, 2016.

(30) Foreign Application Priority Data

May 1, 2015 (JP) .................. 2015-094066
May 29, 2015 (JP) .................. 2015-109959

(51) Int. Cl.
*H05K 1/02* (2006.01)
*F21V 19/00* (2006.01)
(Continued)

(52) U.S. Cl.
CPC ......... *H05K 1/0298* (2013.01); *F21V 19/002* (2013.01); *F21V 19/0025* (2013.01);
(Continued)

(58) Field of Classification Search
CPC .................................................. H05K 1/0298
(Continued)

(56) References Cited

U.S. PATENT DOCUMENTS

2001/0015618 A1* 8/2001 Yamazaki ............ G01N 33/497
313/505
2007/0285370 A1* 12/2007 Kim ...................... G02F 1/1345
345/92

(Continued)

FOREIGN PATENT DOCUMENTS

JP    S63-084966 U    6/1988
JP    2011-134926 A1  7/2011
(Continued)

OTHER PUBLICATIONS

International Search Report and Written Opinion (Application No. PCT/JP2016/002237) dated Aug. 2, 2016.

*Primary Examiner* — Stanley Tso
(74) *Attorney, Agent, or Firm* — Burr & Brown, PLLC

(57) ABSTRACT

A light-emitting module according to an embodiment includes a first insulating film with light transmissive property, a plurality of mesh patterns including a plurality of first line patterns and a plurality of second line patterns, a light-emitting element, and a resin layer. The first line patterns are formed on the first insulating film and are parallel to one another. The second line patterns intersect with the first line patterns and are parallel to one another. The light-emitting element is connected to any two of a plurality of the mesh patterns. The resin layer holds the light-emitting element to the first insulating film. A first mesh pattern and a second mesh pattern adjacent to one another among the plurality of mesh patterns have a boundary. Line patterns projecting from the first mesh pattern to the boundary and line patterns projecting from the second mesh pattern to the boundary are collocated along the boundary in a state of being adjacent to one another.

24 Claims, 36 Drawing Sheets

(51) Int. Cl.
*F21V 23/00* (2015.01)
*H05K 1/11* (2006.01)
*H05K 1/18* (2006.01)
*F21Y 115/10* (2016.01)

(52) U.S. Cl.
CPC ............ *F21V 23/005* (2013.01); *H05K 1/111* (2013.01); *H05K 1/181* (2013.01); *F21Y 2115/10* (2016.08); *H05K 2201/09227* (2013.01); *H05K 2201/09245* (2013.01); *H05K 2201/10106* (2013.01)

(58) Field of Classification Search
USPC ........................................................ 174/260
See application file for complete search history.

(56) References Cited

U.S. PATENT DOCUMENTS

| | | | | |
|---|---|---|---|---|
| 2009/0154176 | A1* | 6/2009 | Matsuoka | H01L 33/486 362/382 |
| 2015/0064628 | A1* | 3/2015 | Guo | G03F 7/30 430/316 |
| 2015/0102376 | A1* | 4/2015 | Toya | H01L 27/322 257/98 |
| 2015/0268770 | A1* | 9/2015 | Cok | G06F 3/047 345/174 |
| 2016/0013376 | A1 | 1/2016 | Maki | |
| 2016/0027973 | A1 | 1/2016 | Maki | |
| 2016/0138767 | A1* | 5/2016 | Luo | F21V 29/70 362/218 |
| 2016/0245491 | A1* | 8/2016 | Kim | H05K 1/0274 |

FOREIGN PATENT DOCUMENTS

| | | |
|---|---|---|
| JP | 2012-084855 A1 | 4/2012 |
| JP | 2015-073103 A1 | 4/2015 |
| WO | 2014/157455 A1 | 10/2014 |

* cited by examiner

FIG.18A

| d2 \ d1 | 1 | 5 | 10 | 20 | 30 | 50 | 100 |
|---|---|---|---|---|---|---|---|
| 1000 | 99.80% | 99.00% | 98.01% | 96.04% | 94.09% | 90.25% | 81.00% |
| 500 | 99.60% | 98.01% | 96.04% | 92.16% | 88.36% | 81.00% | 64.00% |
| 300 | 99.30% | 96.69% | 93.44% | 87.11% | 81.00% | 69.44% | 44.44% |
| 200 | 99.00% | 95.06% | 90.25% | 81.00% | 72.25% | 56.25% | 25.00% |
| 100 | 98.01% | 90.25% | 81.00% | 64.00% | 49.00% | 25.00% | 0.00% |
| 70 | 97.16% | 86.22% | 73.47% | 51.02% | 32.65% | 8.16% | |
| 50 | 96.04% | 81.00% | 64.00% | 36.00% | 16.00% | 0.00% | |
| 30 | 93.44% | 69.44% | 44.44% | 11.11% | 0.00% | | |
| 10 | 81.00% | 25.00% | 0.00% | | | | |

FIG.18B

Conductor Layer Ag

| d2 \ d1 | 1 | 5 | 10 | 20 | 30 | 50 | 100 |
|---|---|---|---|---|---|---|---|
| 1000 | 90.82% | 90.09% | 89.19% | 87.40% | 85.62% | 82.13% | 73.71% |
| 500 | 90.64% | 89.19% | 87.40% | 83.87% | 80.41% | 73.71% | 58.24% |
| 300 | 90.39% | 87.99% | 85.03% | 79.27% | 73.71% | 63.19% | 40.44% |
| 200 | 90.09% | 86.51% | 82.13% | 73.71% | 65.75% | 51.19% | 22.75% |
| 100 | 89.19% | 82.13% | 73.71% | 58.24% | 44.59% | 22.75% | |
| 70 | 88.42% | 78.46% | 66.86% | 46.43% | 29.71% | 7.43% | |
| 50 | 87.40% | 73.71% | 58.24% | 32.76% | 14.56% | | |
| 30 | 85.03% | 63.19% | 40.44% | 10.11% | | | |
| 10 | 73.71% | 22.75% | | | | | |

FIG.18C

Conductor Layer Cu  f1

| d2 \ d1 | 1 | 5 | 10 | 20 | 30 | 50 | 100 |
|---|---|---|---|---|---|---|---|
| 1000 | 90.82% | 90.09% | 89.19% | 87.40% | 85.62% | 82.13% | 73.71% |
| 500 | 90.64% | 89.19% | 87.40% | 83.87% | 80.41% | 73.71% | 58.24% |
| 300 | 90.39% | 87.99% | 85.03% | 79.27% | 73.71% | 63.19% | 40.44% |
| 200 | 90.09% | 86.51% | 82.13% | 73.71% | 65.75% | 51.19% | 22.75% |
| 100 | 89.19% | 82.13% | 73.71% | 58.24% | 44.59% | 22.75% | |
| 70 | 88.42% | 78.46% | 66.86% | 46.43% | 29.71% | 7.43% | |
| 50 | 87.40% | 73.71% | 58.24% | 32.76% | 14.56% | | |
| 30 | 85.03% | 63.19% | 40.44% | 10.11% | | | |
| 10 | 73.71% | 22.75% | | | | | |

LIGHT-EMITTING MODULE

CROSS-REFERENCE TO RELATED APPLICATIONS

This application is continuation of International Application No. PCT/JP2016/002237, filed on Apr. 28, 2016, which is based upon and claims the benefit of priority from the prior Japanese Patent Applications No. 2015-094066 filed on May 1, 2015 and No. 2015-109959 filed on May 29, 2015. The entire specifications, claims, and drawings of Japanese Patent Applications No. 2015-094066 and No. 2015-109959 are herein incorporated in this specification by reference.

FIELD

Embodiments of the present disclosure relate to a light-emitting module.

BACKGROUND

Recently, efforts aiming to a reduction in energy consumption have been regarded as important. From such background, a Light-emitting Diode (LED) whose power consumption is comparatively small attracts attention as a next-generation light source. The LED features downsizing, small amount of heat generation, and good responsiveness. In view of this, the LED has been widely used as a display device, for example, for indoor, for outdoor, for stationary, and for movement; and an optical device such as an indicator lamp, various kinds of switches, a signal device, and a general illumination.

A wire bonding method has been conventionally used to mount this kind of LED to a wiring board. However, the wire bonding method is not suitable for mounting a LED chip to a flexible material such as a flexible substrate. Therefore, techniques for mounting the LED chip without the use of the wire bonding method have been variously proposed.

In a conventional module, the LED chip is disposed between one set of light transmissive films where light transmissive electrodes are formed. This kind of module is required to efficiently supply electric power to the LED chip while securing light transmissive property and flexibility of the module.

This kind of module is required to include a conductor pattern on the light transmissive substrate without sacrificing light transmissive property. However, when the plurality of conductor patterns are disposed on the substrate, a light transmittance at regions between the conductor patterns differs from a light transmittance at regions where the conductor patterns are formed. In view of this, depending on a shape and a positional relationship of the conductor patterns, the light transmittance possibly varies in the entire module. Especially, in the case where the plurality of conductor patterns are gaplessly disposed on the substrate, lines along outer edges of the conductor patterns stand out, also losing limpidity in appearance.

BRIEF DESCRIPTION OF DRAWINGS

FIG. 18A is a (first) drawing illustrating a correspondence table expressing transmittances corresponding to line widths and pitches of thin film conductors constituting the mesh pattern.

FIG. 18B is a (second) drawing illustrating a correspondence table expressing transmittances corresponding to line widths and pitches of thin film conductors constituting the mesh pattern.

FIG. 18C is a (third) drawing illustrating a correspondence table expressing transmittances corresponding to line widths and pitches of thin film conductors constituting the mesh pattern.

DETAILED DESCRIPTION

A light-emitting module according to an embodiment, for example, a first mesh pattern and a second mesh pattern adjacent to one another among a plurality of mesh patterns have a boundary. Line patterns of the first mesh pattern and line patterns of the second mesh pattern are collocated along the boundary in a state of being adjacent to one another.

First Embodiment

The following describes the first embodiment of the present disclosure with reference to the drawings. An XYZ coordinate system constituted of an X-axis, a Y-axis, and a Z-axis perpendicular to one another is used for explanation.

Figure 1:
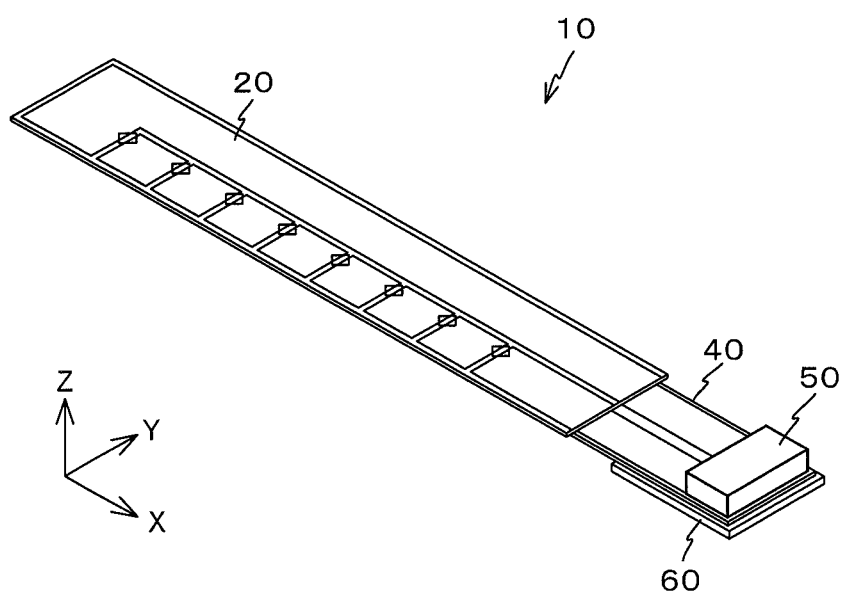
FIG. 1 is a perspective view of a light-emitting module according to a first embodiment.
Figure 2:
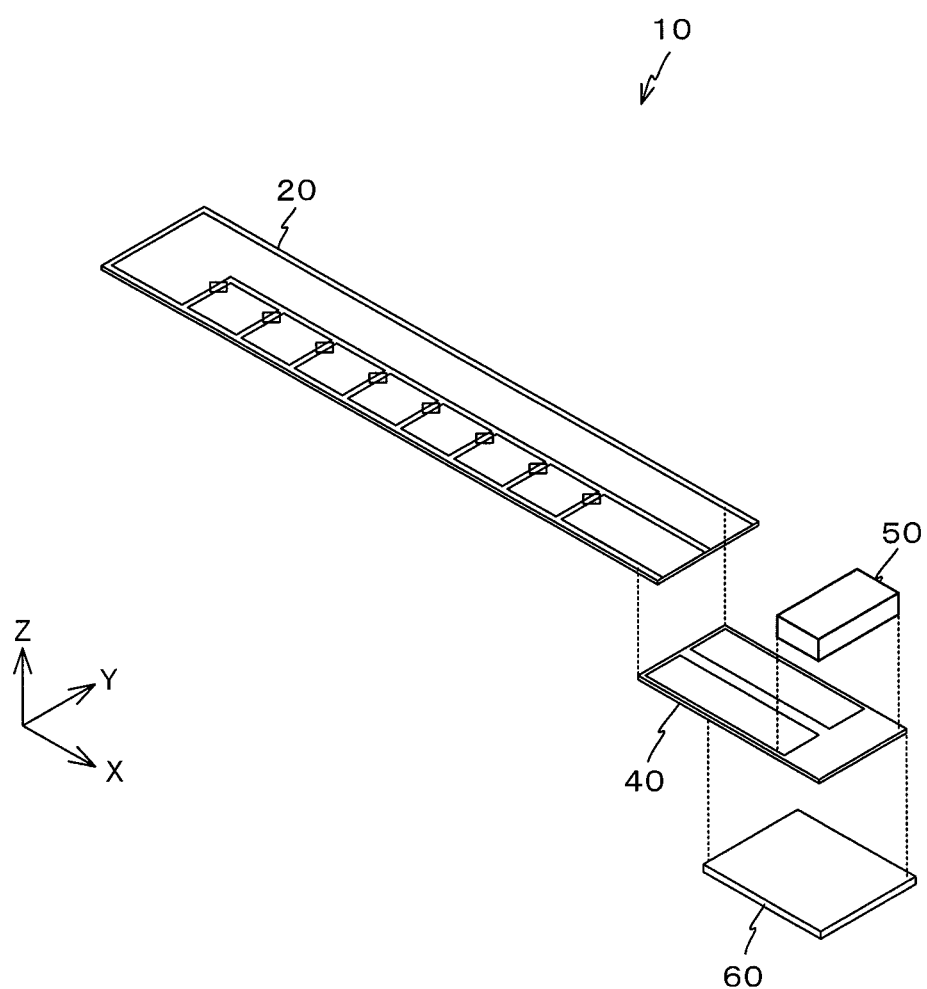
FIG. 2 is a developed perspective view of the light-emitting module.

FIG. 1 is a perspective view of a light-emitting module 10 according to the embodiment. FIG. 2 is a developed perspective view of the light-emitting module 10. As apparent with reference to FIG. 1 and FIG. 2, the light-emitting module 10 includes a light-emitting panel 20, a flexible cable 40, a connector 50, and a reinforcing plate 60.

Figure 3:
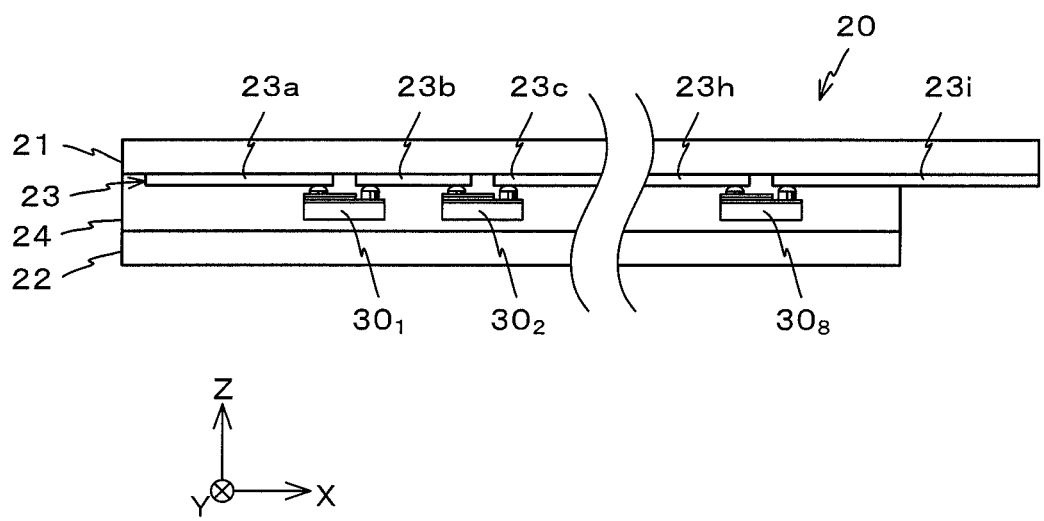
FIG. 3 is a side view of a light-emitting panel.

FIG. 3 is a side view of the light-emitting panel 20. As illustrated in FIG. 3, the light-emitting panel 20 includes one set of light transmissive films 21 and 22, a resin layer 24, which is formed between the light transmissive films 21 and 22, and eight pieces of light-emitting elements $30_1$ to $30_8$, which are disposed inside the resin layer 24.

The light transmissive films 21 and 22 are rectangular films having the longitudinal direction in the X-axis direction. The light transmissive film 21 has the thickness of around 50 to 300 μm and has light transmissive property to visible light. A total light transmittance of the light transmissive film 21 is preferably around 5 to 95%. The total light transmittance means total light transmittance measured compliant with the Japanese Industrial Standards JISK7375: 2008.

The light transmissive films 21 and 22 have flexibility and the flexural modulus is around 0 to 320 kgf/mm² (excluding zero). The flexural modulus is a value measured by a method compliant with ISO178 (JIS K7171:2008).

As the material of the light transmissive films 21 and 22, for example, a polyethylene terephthalate (PET), a polyethylene naphthalate (PEN), a polycarbonate (PC), a polyethylene succinate (PES), an arton (ARTON), and an acrylic resin are considered for use.

Among one set of the light transmissive films 21 and 22, a conductor layer 23 with a thickness of around 0.05 μm to 2 μm is formed on a lower surface (−Z-side surface in FIG. 3) of the light transmissive film 21.

Figure 4:
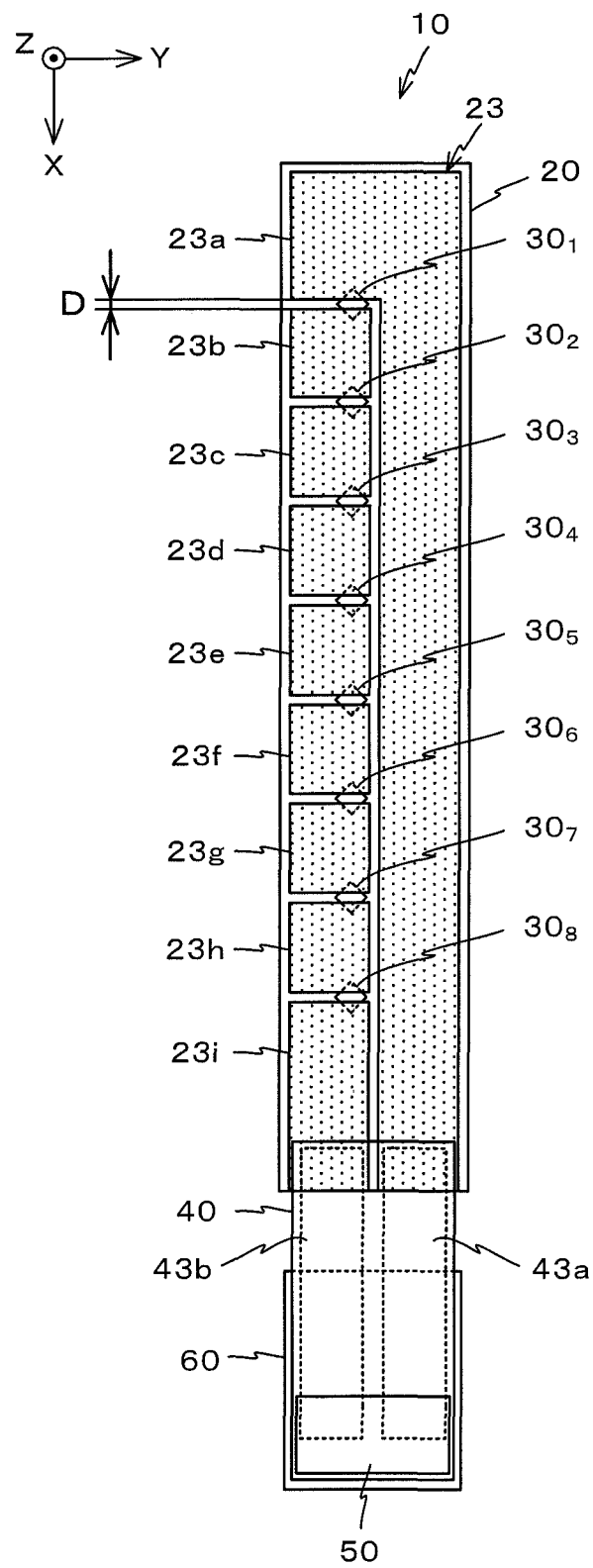
FIG. 4 is a plan view of the light-emitting module.

FIG. 4 is a plan view of the light-emitting module 10. As apparent with reference to FIG. 3 and FIG. 4, the conductor layer 23 is constituted of an L-shaped mesh pattern 23a, which is formed along the +Y-side outer edge of the light transmissive film 21, and rectangular mesh patterns 23b to 23i, which are collocated along the −Y-side outer edge of the light transmissive film 21. The mesh patterns 23a to 23i are made of a metallic material such as a copper (Cu) and an argentum (Ag). In the light-emitting module 10, a distance D between the mesh patterns 23a to 23i is about 100 μm or less.

As apparent with reference to FIG. 3, in the light-emitting module 10, the light transmissive film 22 has a length in the X-axis direction shorter than that of the light transmissive film 21. In view of this, the +X-side ends of the mesh pattern 23a and the mesh pattern 23i constituting the conductor layer 23 are exposed.

The resin layer 24 is formed between the light transmissive films 21 and 22. The resin layer 24 has light transmissive property to the visible light.

The resin layer 24 has a Vicat softening temperature in a range of 80° C. or more to 160° C. or less and a tensile storage elastic modulus from 0° C. to 100° C. in a range of 0.01 GPa or more to 10 GPa or less. The tensile storage elastic modulus of the resin layer 24 at the Vicat softening temperature is 0.1 MPa or more. A melting temperature of the resin layer 24 is 180° C. or more or preferably higher than the Vicat softening temperature by 40° C. or more. A glass-transition temperature of the resin layer 24 is preferably −20° C. or less. The resin layer 24 is a thermoplastic resin, for example, a thermoplastic elastomer. As the elastomer used for the resin layer 24, for example, an acrylic-based elastomer, an olefin-based elastomer, a styrene-based elastomer, an ester-based elastomer, and an urethane-based elastomer are considered.

Figure 5:
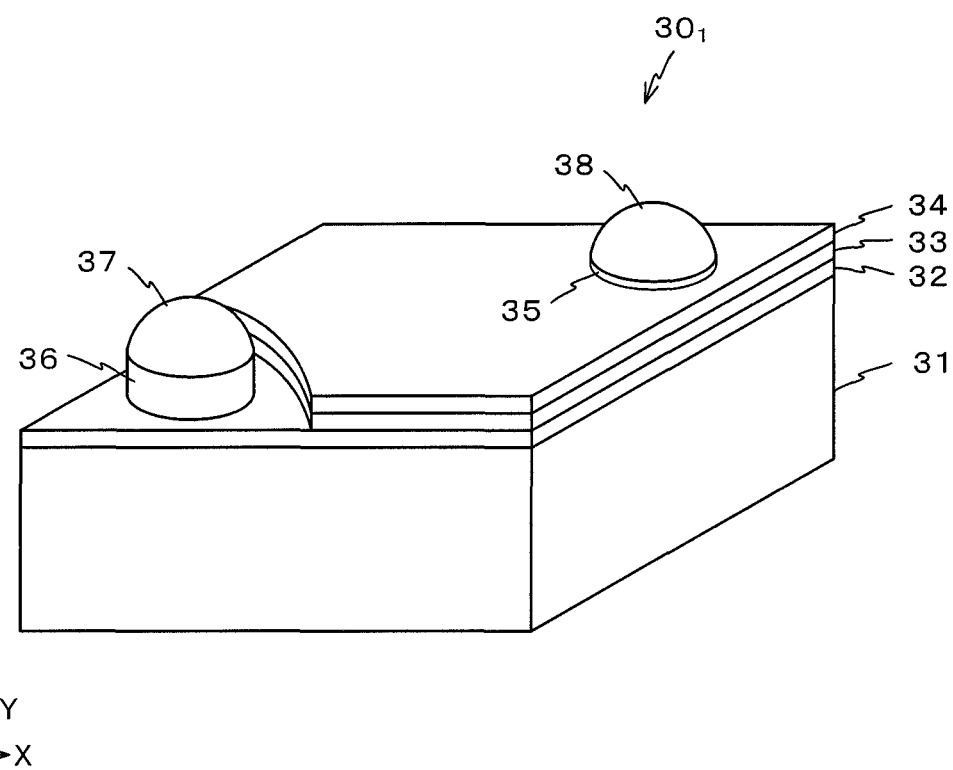
FIG. 5 is a perspective view of a light-emitting element.

The light-emitting element $30_1$ is a square LED chip with one side of 0.3 mm to 3 mm. As illustrated in FIG. 5, the light-emitting element $30_1$ is an LED chip with a four-layer structure constituted of a base substrate 31, an N-type semiconductor layer 32, an active layer 33, and a P-type semiconductor layer 34. The light-emitting element $30_1$ has a rated voltage of about 2.5 V.

The base substrate 31 is a sapphire substrate or a semiconductor substrate. The N-type semiconductor layer 32 with a shape identical to this base substrate 31 is formed on the top surface of the base substrate 31. The active layer 33 and the P-type semiconductor layer 34 are laminated in order on the top surface of the N-type semiconductor layer 32. A cutout is formed at a corner part on the −Y-side and the −X-side of the active layer 33 and the P-type semiconductor layer 34 laminated on the N-type semiconductor layer 32. The surface of the N-type semiconductor layer 32 is exposed from this cutout. The use of one having light transmissive property as the base substrate 31 radiates light from both upper and lower surfaces of the light-emitting element.

A pad 36 is formed at the part of the N-type semiconductor layer 32 exposed from the active layer 33 and the P-type semiconductor layer 34 for electrical connection to the N-type semiconductor layer 32. A pad 35 is formed at a corner part on the +X-side and the +Y-side of the P-type semiconductor layer 34 for electrical connection to the P-type semiconductor layer 34. The pads 35 and 36 are made of a copper (Cu) or a gold (Au) and includes bumps 37 and 38 on the top surfaces. The bumps 37 and 38 are made of a metal such as a gold (Au) and a gold alloy. As the bumps 37 and 38, instead of the metal bump, a solder bump shaped to a hemispherical shape may be used. In a light-emitting element 30, the bump 37 functions as a cathode electrode and the bump 38 functions as an anode electrode.

Figure 6:
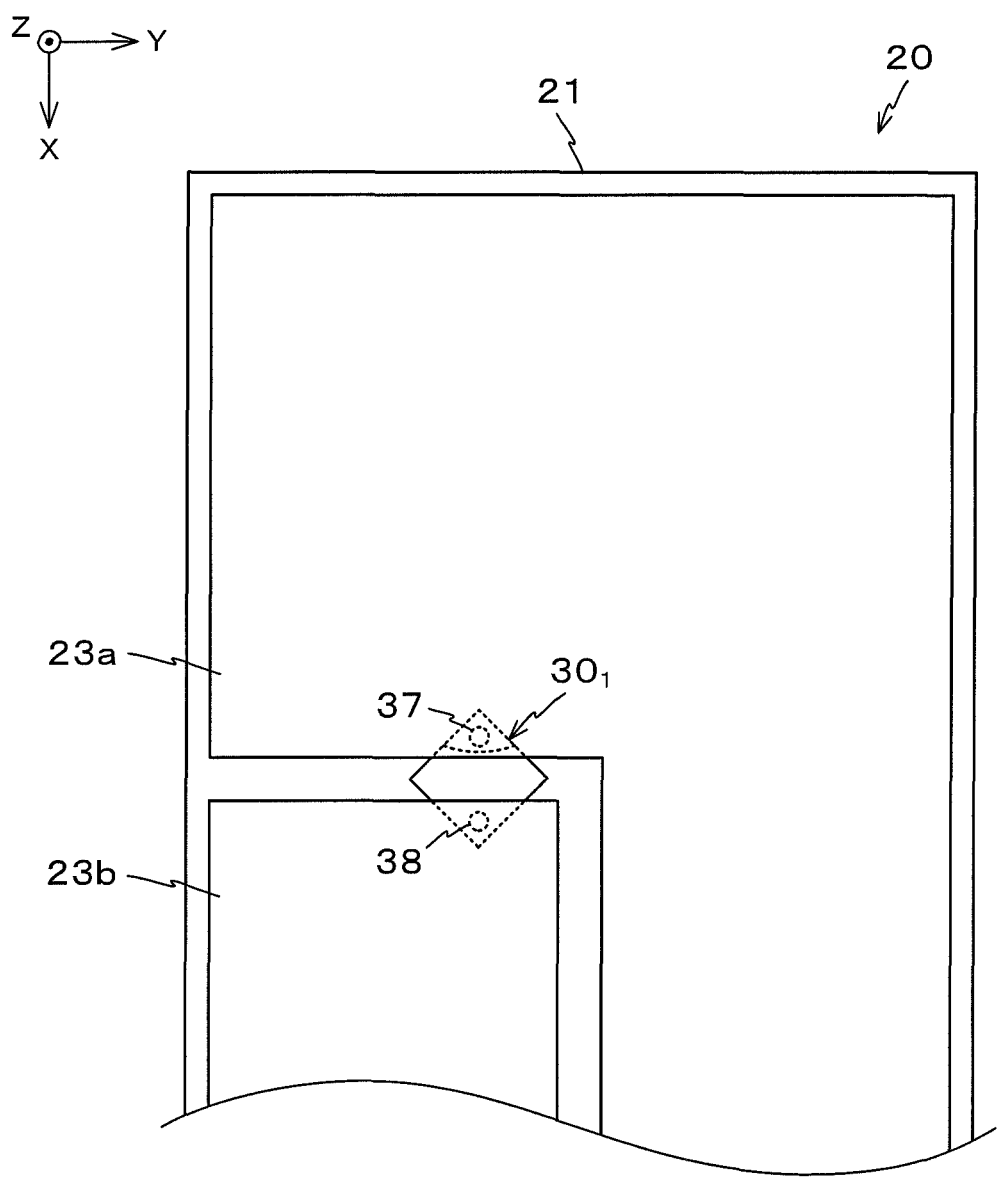
FIG. 6 is a drawing illustrating the light-emitting element connected to a mesh pattern.

As illustrated in FIG. 6, the light-emitting element $30_1$ constituted as described above is disposed between the mesh patterns 23a and 23b. While the bump 37 is connected to the mesh pattern 23a, the bump 38 is connected to the mesh pattern 23b.

Figure 7:
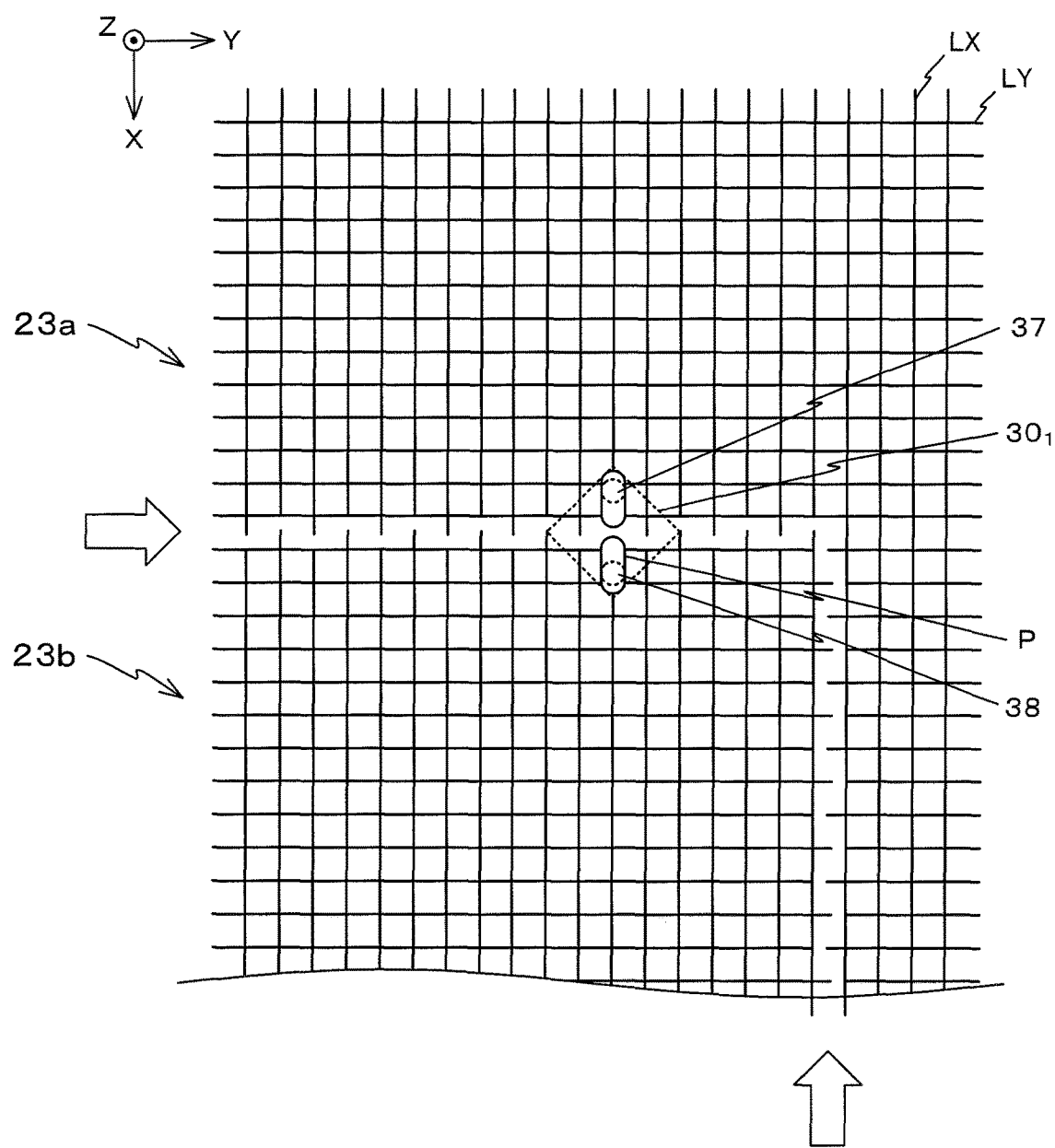
FIG. 7 is a drawing illustrating enlarged mesh patterns.

FIG. 7 is drawing illustrating the enlarged mesh patterns 23a and 23b. As apparent with reference to FIG. 7, the mesh patterns 23a and 23b are constituted of a plurality of line patterns LX parallel to the X-axis and a plurality of line patterns LY parallel to the Y-axis. The mesh patterns 23a to 23i each include a connecting pad P to which the bumps 37 and 38 of the light-emitting element 30 are connected.

The respective line widths of the line patterns LX and LY are about 10 μm and are formed at pitches of about 300 μm. As indicated by the arrow in FIG. 7, end portions of the line patterns LX constituting the mesh pattern 23a project every other line pattern LX at the boundary parallel to the Y-axis among boundaries of the mesh patterns 23a and 23b. Similarly, end portions of the line patterns LX constituting the mesh pattern 23b project every other line pattern LX at the boundary of the mesh patterns 23a and 23b parallel to the Y-axis. In view of this, at the boundary of the mesh patterns 23a and 23b, the line patterns LX of the mesh pattern 23a and the line patterns LX of the mesh pattern 23b are arranged in alternation along this boundary.

End portions of the line patterns LY constituting the mesh pattern 23a project every other line pattern LY at the boundary parallel to the X-axis among boundaries of the mesh patterns 23a and 23b. Similarly, end portions of the line patterns LY constituting the mesh pattern 23b project every other line pattern LY at the boundary of the mesh patterns 23a and 23b parallel to the X-axis. In view of this, at the boundary of the mesh patterns 23a and 23b, the line patterns LY of the mesh pattern 23a and the line patterns LY of the mesh pattern 23b are arranged in alternation along this boundary.

As illustrated in FIG. 7, the light-emitting element $30_1$ is disposed across the mesh patterns 23a and 23b so as to traverse the boundary. The bump 37 is connected to the connecting pad P disposed at the mesh pattern 23a, and the bump 38 is connected to the connecting pad P disposed at the mesh pattern 23b.

The mesh patterns 23c to 23i are also formed similarly to the mesh patterns 23a and 23b illustrated in FIG. 7. Other light-emitting elements $30_2$ to $30_8$ also have a configuration similar to the light-emitting element $30_1$.

The light-emitting element $30_2$ is disposed between the mesh patterns 23b and 23c, and the bumps 37 and 38 are connected to the respective mesh patterns 23b and 23c. Hereinafter, similarly, the light-emitting element $30_3$ is disposed across the mesh patterns 23c and 23d. The light-emitting element $30_4$ is disposed across the mesh patterns 23d and 23e. The light-emitting element $30_5$ is disposed across the mesh patterns 23e and 23f. The light-emitting element $30_6$ is disposed across the mesh patterns 23f and 23g. The light-emitting element $30_7$ is disposed across the mesh patterns 23g and 23h. The light-emitting element $30_8$ is disposed across the mesh patterns 23h and 23i. Thus, the mesh patterns 23a to 23i and the light-emitting elements $30_1$ to $30_8$ are connected in series. In the light-emitting panel 20, the light-emitting elements 30 are disposed at intervals of 10 mm.

Figure 8:
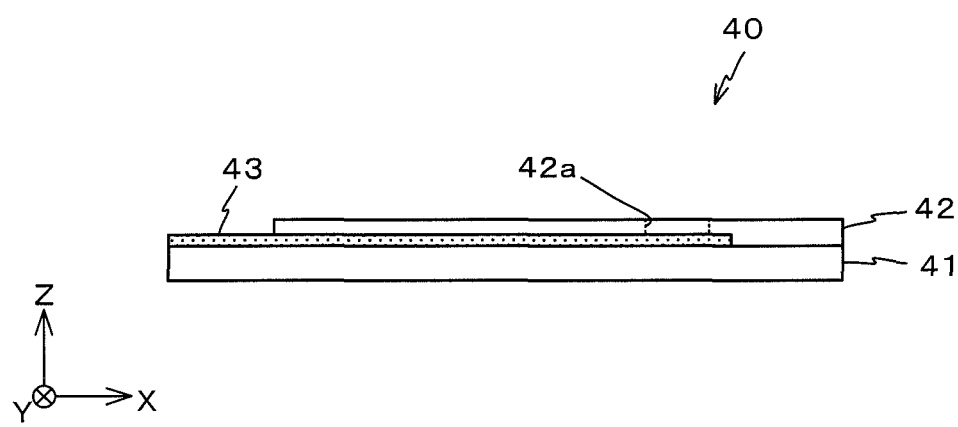
FIG. 8 is a side view of a flexible cable.

FIG. 8 is a side view of the flexible cable 40. As illustrated in FIG. 8, the flexible cable 40 is constituted of a base material 41, a conductor layer 43, and a coverlay 42.

The base material 41 is a rectangular member having the longitudinal direction in the X-axis direction. This base material 41 is, for example, made of a polyimide and includes the conductor layer 43 on the top surface. The conductor layer 43 is formed by patterning a copper foil pasted to the top surface of the polyimide. As illustrated in FIG. 4, the conductor layer 43 of this embodiment is constituted of two conductor patterns 43a and 43b.

As illustrated in FIG. 8, the conductor layer 43, which is formed on the top surface of the base material 41, is coated by the coverlay 42 on which vacuum thermocompression bonding is performed. This coverlay 42 has a length shorter than the base material 41 in the X-axis direction. In view of this, end portions on the −X-side of the conductor patterns 43a and 43b constituting the conductor layer 43 are exposed. The coverlay 42 has an opening 42a from which the end portions on the +X-side of the conductor patterns 43a and 43b are exposed.

Figure 9:
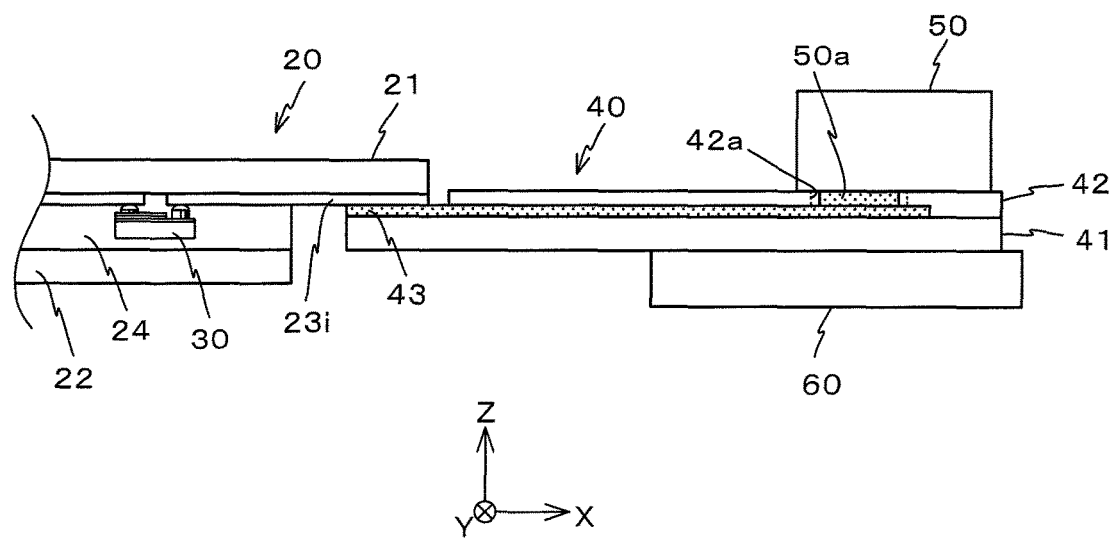
FIG. 9 is a drawing describing a point of connecting of the light-emitting panel to the flexible cable.

As apparent with reference to FIG. 4 and FIG. 9, the flexible cable 40 configured as described above is bonded to the light-emitting panel 20 while the conductor patterns 43a and 43b exposed from the coverlay 42 are in contact with the end portions on the +X-side of the mesh patterns 23a and 23i of the light-emitting panel 20.

As illustrated in FIG. 2, the connector 50 is a rectangular parallelepiped-shaped component. A cable extended from a DC power supply is connected to the connector 50. The connector 50 is implemented on the end portion on the +X-side of the top surface of the flexible cable 40. As illustrated in FIG. 9, when the connector 50 is implemented on the flexible cable 40, a pair of respective terminals 50a of the connector 50 are connected to the conductor patterns 43a and 43b constituting the conductor layer 43 via the opening 42a disposed at the coverlay 42.

As illustrated in FIG. 2, the reinforcing plate 60 is a rectangular plate-shaped member having the longitudinal direction in the X-axis direction. The reinforcing plate 60 is, for example, made of an epoxy resin and an acrylic. As illustrated in FIG. 9, this reinforcing plate 60 is pasted to the lower surface of the flexible cable 40. In view of this, the flexible cable 40 can be bent between the −X-side end of the reinforcing plate 60 and the +X-side end of the light-emitting panel 20.

Figure 10:
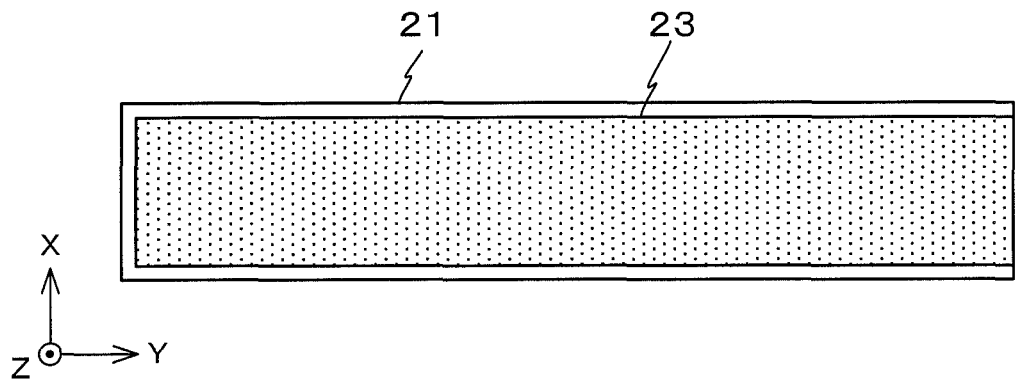
FIG. 10 is a drawing describing a point of manufacturing the mesh patterns.

The following describes a method for manufacturing the light-emitting panel 20 constituting the above-described light-emitting module 10. First, the light transmissive film 21 made of PET is prepared. As illustrated in FIG. 10, the mesh-like conductor layer 23 is formed on the entire surface of the light transmissive film 21 using, for example, a subtract method or an additive method. Cutting this conductor layer 23 using laser forms the mesh patterns 23a to 23i.

Figure 11:
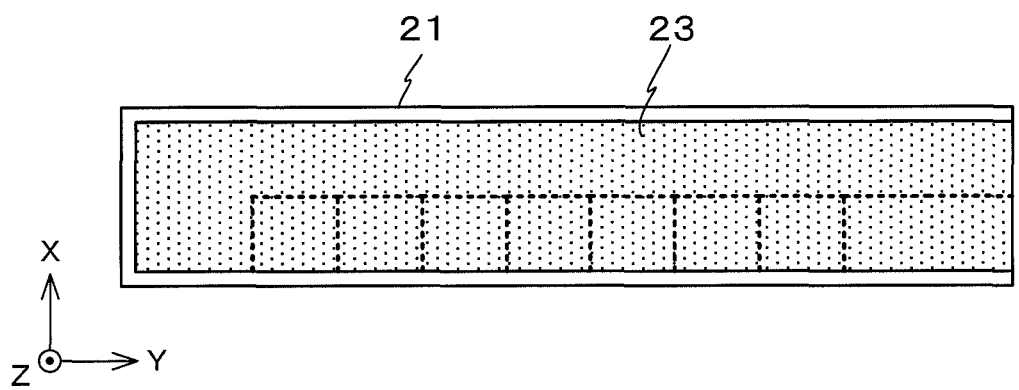
FIG. 11 is a drawing describing the point of manufacturing the mesh patterns.
Figure 12:
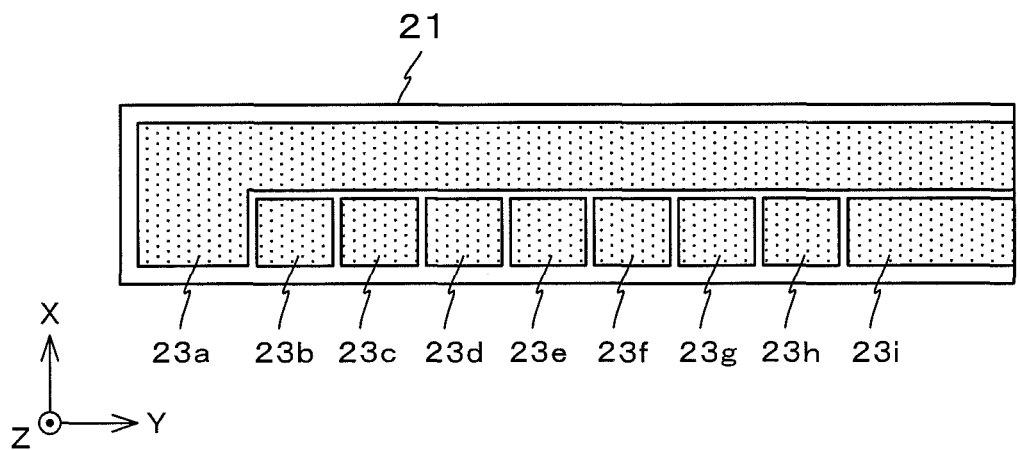
FIG. 12 is a drawing describing the point of manufacturing the mesh patterns.

The conductor layer 23 is cut by irradiating laser light to the conductor layer 23, which is formed on the surface of the light transmissive film 21. A laser spot of the laser light is moved along the dotted line illustrated in FIG. 11. Thus, the conductor layer 23 is cut along the dotted line and as illustrated in FIG. 12, the mesh patterns 23a to 23i are formed.

Figure 13:
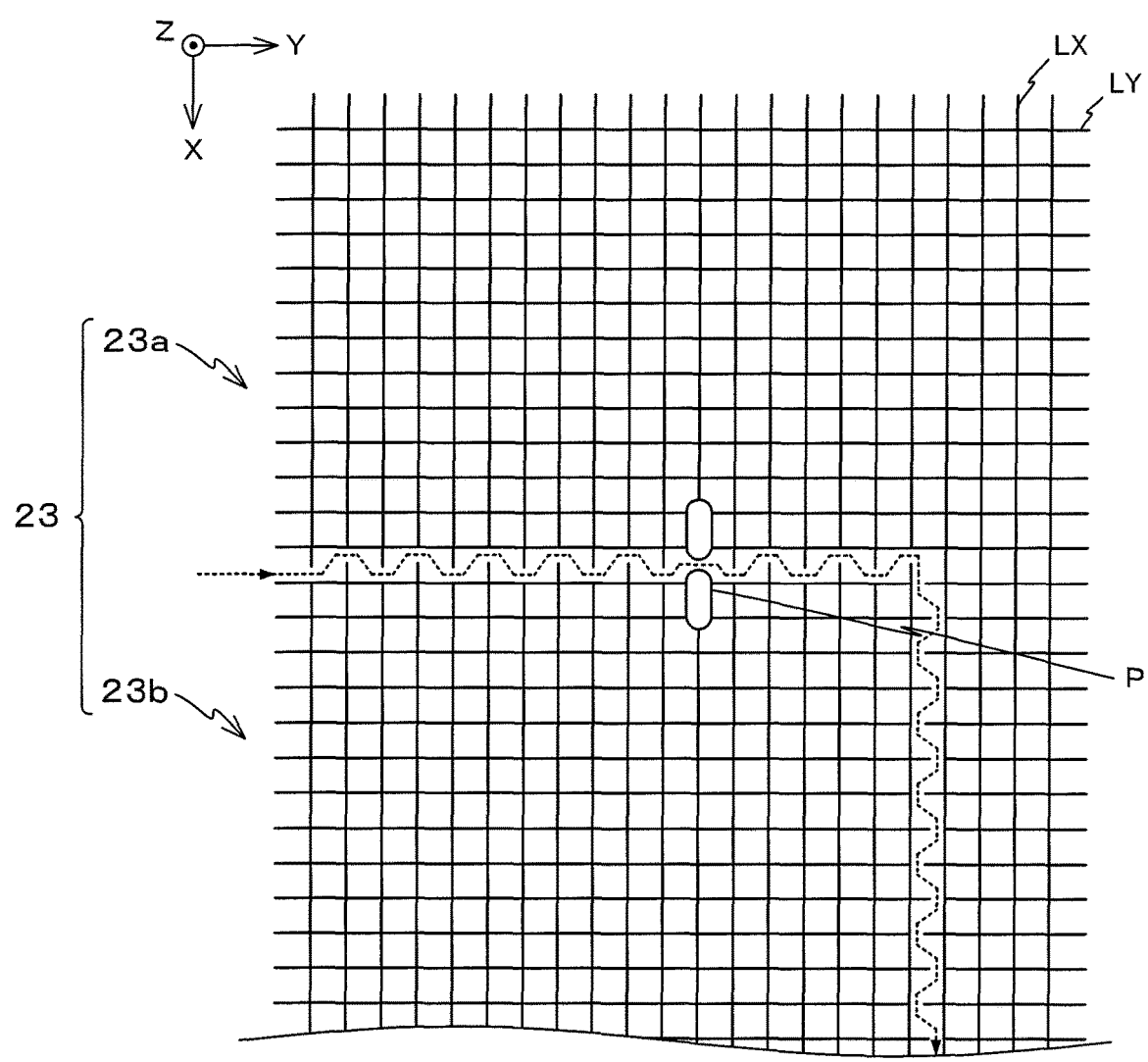
FIG. 13 is a drawing describing a point of manufacturing the mesh patterns.

FIG. 13 is a drawing illustrating the enlarged conductor layer 23. As illustrated in FIG. 12, to move the laser spot and cut the conductor layer 23, as illustrated by the dotted line in the drawing, the laser spot is moved zigzag with amplitude smaller than the arrangement pitches of the line patterns LX and LY. Accordingly, at the boundary of the adjacent mesh patterns, the end portions of one mesh pattern and the end portions of the other mesh pattern are arranged in alternation along the boundary.

Figure 14:
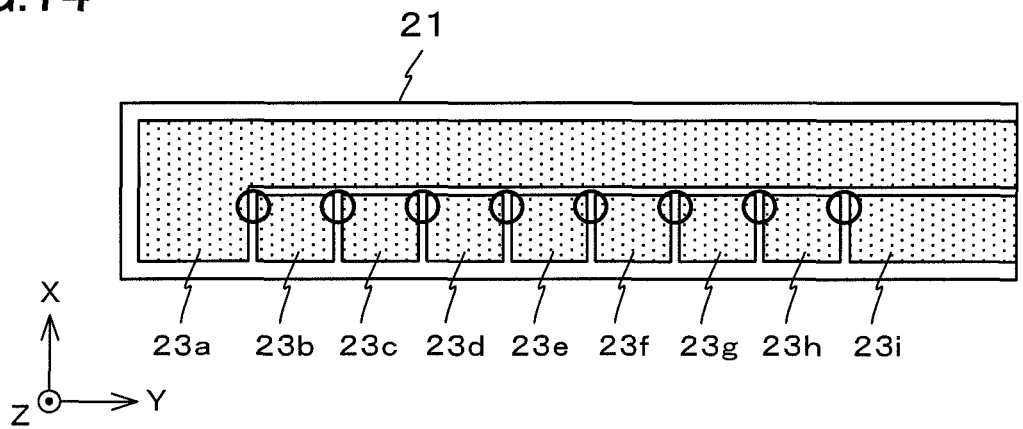
FIG. 14 is a drawing describing a point of manufacturing the mesh patterns.

As illustrated in FIG. 13, this embodiment preliminarily forms the connecting pad P at the conductor layer 23. The connecting pad P is disposed corresponding to the position on which the light-emitting element 30 is implemented when the conductor layer 23 is formed. When the laser spot of the laser light moves on the surface of the conductor layer 23 along the dotted line illustrated in FIG. 13, a part of the line patterns LX and LY near the movement path of the laser spot melt and sublime. This cuts out the mesh patterns 23a to 23i and the pair of connecting pads P electrically insulated to one another are formed. The light-emitting panel 20 includes the pair of connecting pads P at positions indicated by the 0 marks in FIG. 14.

Figure 15:
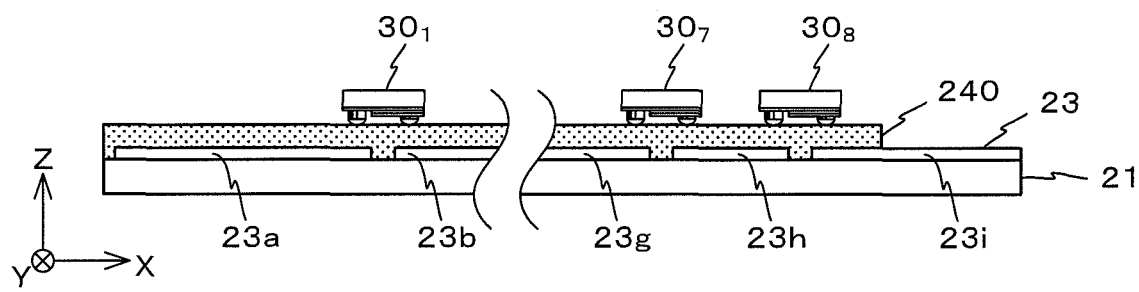
FIG. 15 is a drawing describing a point of manufacturing the light-emitting panel.

Next, as illustrated in FIG. 15, a thermoplastic resin 240 is disposed on the surface of the light transmissive film 21 on which the mesh patterns 23a to 23i are formed. The light-emitting elements $30_1$ to $30_8$ are disposed on the thermoplastic resin 240. At this time, the light-emitting elements $30_1$ to $30_8$ are positioned such that the connecting pads P formed at the mesh patterns 23a to 23i are positioned immediately below the bumps 37 and 38 of the light-emitting elements $30_1$ to $30_8$.

Figure 16:
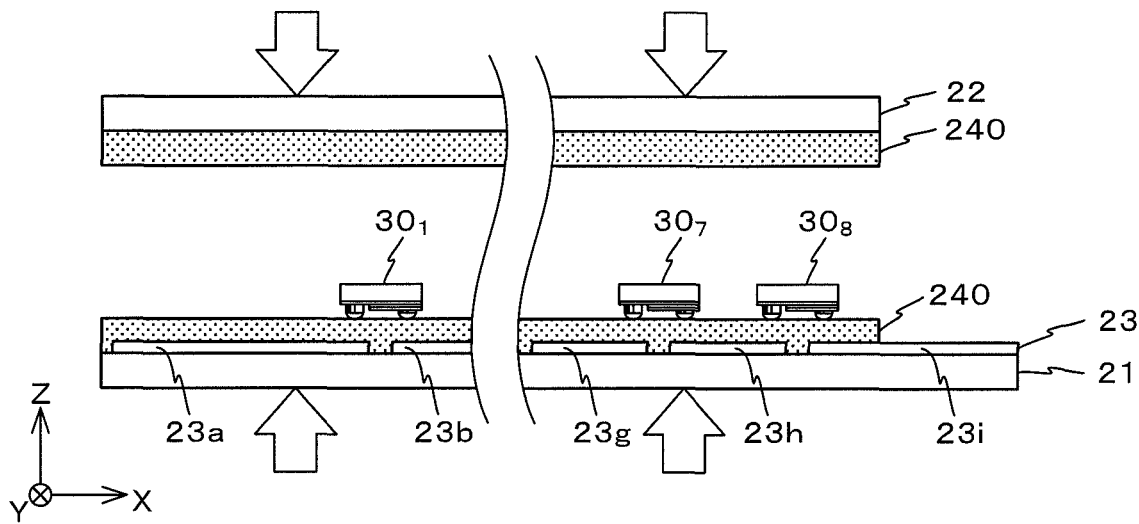
FIG. 16 is a drawing describing a point of manufacturing the light-emitting panel.

Next, as illustrated in FIG. 16, the light transmissive film 22 where the thermoplastic resin 240 is disposed at the lower surface is disposed on the top surface side of the light transmissive film 21. The light transmissive films 21 and 22 are heated and pressurized under vacuum atmosphere for press bonding. Accordingly, first, the bumps 37 and 38 formed on the light-emitting element 30 penetrate the thermoplastic resin 240, reach the mesh patterns 23a to 23i, and are electrically connected to these mesh patterns 23a to 23i. Then, the thermoplastic resin 240 is gaplessly filled between the conductor layer 23, the light transmissive films 21 and 22, and the light-emitting element 30. As illustrated in FIG. 3, the thermoplastic resin 240 becomes the resin layer 24 that holds the light-emitting element 30 between the light transmissive films 21 and 22. Through the above-described processes, the light-emitting panel 20 is completed.

As illustrated in FIG. 9, the flexible cable 40 to which the reinforcing plate 60 is pasted is connected to the light-emitting panel 20 configured as described above. Implementing the connector 50 to this flexible cable 40 completes the light-emitting module 10 illustrated in FIG. 1.

With the light-emitting module 10 configured as described above, when a DC voltage is applied to the conductor patterns 43a and 43b illustrated in FIG. 4 via the connector 50, the light-emitting element 30 constituting the light-emitting panel 20 emits the light. Since the rated voltage of the light-emitting element 30 is approximately 2.5 V, a voltage around 20 V is applied to the conductor patterns 43a and 43b of the light-emitting module 10.

As described above, as illustrated in FIG. 7, with the light-emitting module 10 according to the embodiment, the end portions of the line patterns LX and LY constituting the one mesh pattern and the end portions of the line patterns LX and LY constituting the other mesh pattern project at the boundary between one set of the adjacent mesh patterns. The line patterns of the one mesh pattern and the line patterns of the other mesh pattern are disposed in alternation along the boundary. Thus, a gap (a slit) between the mesh patterns 23a to 23i is not a straight line but becomes a zigzag shape, in other words, a wave shape. This disperses parts where the light transmittance is high; therefore, the boundary of the mesh patterns constituting the light-emitting module 10 becomes unnoticeable.

For example, in the case where only the line patterns of the one mesh pattern project at the boundary of the mesh patterns or the line patterns of both of the adjacent mesh patterns do not project at the boundary, the regions with high transmittance concentrate along the boundary of the mesh patterns. In this case, the boundary of the mesh patterns stands out. Meanwhile, this embodiment disposes the end portions of the line patterns extending from the different mesh patterns in alternation along the boundary. Accordingly, the boundary of the mesh patterns becomes unnoticeable.

With this embodiment, the light-emitting element 30 is connected with the mesh patterns 23a to 23i. These mesh patterns 23a to 23i are constituted of a metal thin film with the line width of about 10 µm. This ensures sufficiently securing the light transmissive property and the flexibility of the light-emitting panel 20.

With this embodiment, the conductor layer 23 constituted of the mesh patterns 23a to 23i is formed on the top surface of the light transmissive film 21 among one set of the light transmissive films 21 and 22. In view of this, the light-emitting panel 20 according to the embodiment becomes thinner than a light-emitting panel where conductor layers are formed on both the top surface and the lower surface of the light-emitting element 30. This ensures improving the flexibility and a degree of light transmissive property of the light-emitting panel 20.

This embodiment describes the case where the end portions of the line patterns LX and LY constituting the one mesh pattern and the end portions of the line patterns LX and LY constituting the other mesh pattern are disposed in alternation at the boundary of one set of the adjacent mesh patterns. The configuration is not limited to this. For example, the end portions of the line patterns LX and LY constituting the one mesh pattern and the end portions of the line patterns LX and LY constituting the other mesh pattern may be alternately disposed at every plural pieces along the boundary.

For example, the end portions of the line patterns LX and LY constituting the one mesh pattern and the end portions of the line patterns LX and LY constituting the other mesh pattern may be alternately arranged at every two pieces at the boundary between one set of the adjacent mesh patterns.

Figure 17:
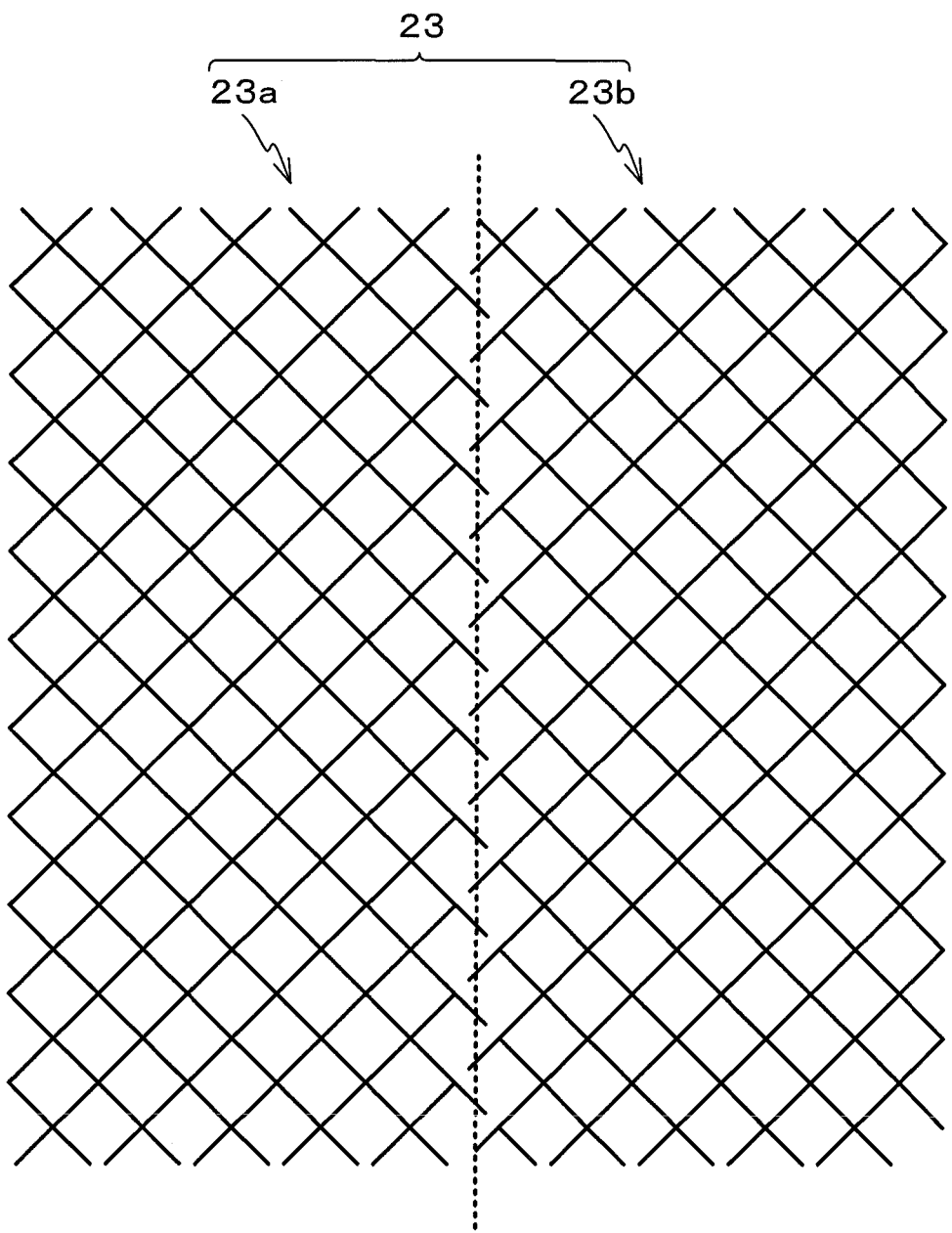
FIG. 17 is a drawing illustrating a modification of the mesh patterns.

For example, as illustrated in FIG. 13, this embodiment describes the case where the end portions of the one mesh pattern 23a and the end portions of the other mesh pattern 23b projecting at the boundary between the adjacent mesh patterns are parallel. The configuration is not limited to this. As illustrated in FIG. 17, the end portions of the one mesh pattern 23a does not have to be parallel to the end portions of the other mesh pattern 23b.

While the embodiment uses the thermoplastic resin as the resin layer 24, a thermosetting resin may be used. Additionally, while the embodiment forms the mesh-like conductor layer 23 and then cuts the conductor layer 23 using the laser to form the mesh patterns 23a to 23i, the configuration is not limited to this. A solid conductor layer is formed on the entire surface and then a mesh process of the conductor layer and a cutting-out process of the mesh patterns 23a to 23i may be simultaneously performed by one-time photoetching. The mesh patterns 23a to 23i may be formed by one-time printing process.

The mesh patterns 23a and 23i may be extracted with the mesh patterns and the conductor patterns stacked and brought into contact at the peripheral portion of the light-emitting panel. Conductor layers (solid regions) on which the mesh process is not performed may be left at the ends of the mesh patterns 23a and 23i, and the conductor patterns may be stacked on and brought into contact with the conductor layers.

While the embodiment connects the eight pieces of LEDs in series and the power lines and the series-connecting wiring parts are configured as the mesh patterns, a two-dimensional array where the series-connected LEDs are additionally connected in series may be configured.

While the first embodiment describes the case where a line width d1 of the thin film conductors constituting the mesh pattern is 10 μm and an arrangement pitch d2 of the thin film conductors is about 300 μm, the values of the line width d1 and the arrangement pitch d2 can be variously changed. However, it is preferable that the line width d1 is in a range of 1 μm or more to 100 μm or less, and the arrangement pitch d2 is in a range of 10 μm or more to 1000 μm or less.

FIG. 18A illustrates a correspondence table expressing transmittances Pe1 of the mesh pattern (the conductor layer) itself corresponding to the line widths d1 of the mesh pattern and the arrangement pitches d2 of the mesh pattern. The unit of the line widths d1 and the arrangement pitches d2 is micron (μm). With reference to FIG. 18A, to secure the light transmissive property of the light-emitting module 10, it is considered to set the line width d1 and the arrangement pitch d2 such that, for example, the transmittance Pe becomes 75% or more. It is also considered to set the line width d1 and the arrangement pitch d2 such that a sheet resistance of the mesh pattern becomes 100Ω (100Ω/☐) or less.

For example, with the line width d1 of the mesh pattern of 1 μm, the arrangement pitch d2 of the mesh pattern where the transmittance Pe1 of the mesh pattern becomes 75% or more and the sheet resistance of the mesh pattern becomes 100Ω or less is 10 μm. With the line width d1 of the mesh pattern of 5 μm, the arrangement pitch d2 of the mesh pattern where the transmittance Pe1 becomes 75% or more and the sheet resistance of the mesh pattern becomes 100Ω or less is 50 to 300 μm. Similarly, the arrangement pitch d2 where the transmittance Pe1 of the mesh pattern becomes 75% or more and the sheet resistance of the mesh pattern becomes 100Ω or less is 100 to 500 μm with d1 of 10 μm, 200 to 500 μm with d1 of 20 μm, 300 to 500 μm with d1 of 30 μm, 500 to 1000 μm with d1 of 50 μm, and 1000 μm with d1 of 100 μm.

This secures the light transmissive property of the light-emitting module 10 and also ensures decreasing the resistance of the mesh pattern. It is only necessary to select the line width and the arrangement pitch of the mesh pattern from the above-described d1 and d2 ranges. The above-described example specifies the upper limit of d2 by the sheet resistance and a similar specification of the argentum (Ag) mesh.

The transmittance may be set configuring the mesh pattern (the conductor layer) and the light transmissive film as one unit. The transmittance of a PET film with the thickness of 100 μm is approximately 91%. In this case, a transmittance Pe2 of the unit constituted of the conductor layer 23 and the light transmissive film 21 is preferably a value obtained by multiplying the transmittance Pe1 in the correspondence table illustrated in FIG. 18A by 0·91 (=91%).

For example, the transmittances Pe2 in the correspondence tables illustrated in FIG. 18B and FIG. 18C become the values found by multiplying the transmittance Pe1 by 0.91 (=91%). In the case where the conductor layer 23 is formed on the light transmissive film 21, the line width d1 and the arrangement pitch d2 of the mesh pattern need to be set such that the transmittances Pe2 illustrated in FIG. 18B (the Ag mesh) and FIG. 18C (the Cu mesh) become 75% or more.

For example, with the conductor layer 23 being made of the argentum (Ag), to set the transmittance Pe2 of 75% or more and the sheet resistance of the mesh pattern of 100Ω (100Ω/☐) or less, the line width d1 and the arrangement pitch d2 need to be set corresponding to the matrix colored in the correspondence table illustrated in FIG. 18B. This secures the light transmissive property of the light-emitting module 10 and also ensures decreasing the resistance of the mesh pattern. Here, the sheet resistance 100Ω corresponds to almost 90% of the transmittance Pe2.

With the conductor layer 23 made of the argentum, the sheet resistance becomes around 50Ω/☐ or less when the line width d1 of 10 μm and the arrangement pitch d2 of 500 μm, or the line width d1 of 5 μm and the arrangement pitch d2 of 300 μm.

With the conductor layer 23 made of the copper (Cu), to set the sheet resistance of the mesh pattern to 100Ω (100Ω/☐) or less, the line width d1 and the arrangement pitch d2 need to be set corresponding to the matrix colored in the correspondence table illustrated in FIG. 18C. This secures the light transmissive property of the light-emitting module 10 and also ensures decreasing the sheet resistance of the mesh pattern. While in the range surrounded by a frame f1 in FIG. 18C, the sheet resistance of the mesh pattern becomes 100Ω (100Ω/☐) or less, the line width d1 is too small relative to the arrangement pitch d2. In view of this, d1 and d2 corresponding to this range may be removed from the setting values of the line width and the arrangement pitch.

With the conductor layer 23 made of the copper, the sheet resistance becomes around 10Ω/☐ or less when the line width d1 of 5 μm and the arrangement pitch d2 of 300 μm, or the line width d1 of 10 μm and the arrangement pitch d2 of 500 μm.

As described above, the transmittance of the mesh pattern is preferably 75% or more. Considering the mesh pattern and the light transmissive film 21 as a unit, the transmittance may be configured to be 75% or more. Alternatively, considering the mesh pattern, the light transmissive film 21, and the resin layer 24 as a unit, the total transmittance may be configured to be 60% or more, 70% or more, or 75% or more. Further, considering the mesh pattern, the light transmissive films 21 and 22, and the resin layer 24 as a unit, the total transmittance may be configured to be 60% or more, 70% or more, or 75% or more.

The sheet resistance of the mesh pattern is preferably 100Ω (100Ω/☐) or less. With the mesh pattern made of the argentum (Ag), obtaining the sheet resistance below 50Ω is also possible. Accordingly, the mesh pattern with the sheet resistance of 70Ω/☐ or less, for example, 50Ω/☐ or less can be easily achieved using the argentum, an argentum alloy, or a similar material. By the use of the copper (Cu), obtaining the sheet resistance less below 10Ω is also possible. Accordingly, the mesh pattern with the sheet resistance of 30Ω/☐ or less, for example, 10Ω/☐ or less can be achieved using the copper, a copper alloy, or a similar material.

As the mesh pattern, in addition to the argentum (Ag) and the copper (Cu), an alloy and a compound of these materials may be used. For example, with the argentum, Ag—Cu, Ag—Cu—Sn, and a silver chloride (Ag—Cl), and with the copper, Cu—Cr and a similar material are applicable.

Regarding the line width d1 of the mesh pattern and the arrangement pitch d2 of the mesh pattern, the larger line width d1 and arrangement pitch d2 make the line of the mesh pattern stand out. In view of this, the line width d1 is preferably set to 50 µm or less and d2 to 1000 µm or less. Preferably, the line width d1 is 20 µm or less and the arrangement pitch d2 is 500 µm or less, and more preferably the line width d1 is 15 µm or less and the arrangement pitch d2 of 300 µm or less. As one example, the line width d1 is 20 µm or less and the arrangement pitch d2 is 500 µm or less.

The film thickness of the mesh pattern is configured to be 1 to 2 µm. The one shown in FIG. 18C where the line width d1 of 1 µm and the arrangement pitch d2 of 200 to 1000 µm has an elongate shape, closing to an isolation pattern. Therefore, the use of the one with the smaller arrangement pitch d2 is preferable so as not to fall over the line pattern. The preferable ratio of the line width/arrangement pitch (d1/d2) in terms of reliability is 0.002 or more.

Second Embodiment

The following describes the second embodiment of the present disclosure with reference to the drawings. Like reference numerals designate corresponding or identical elements throughout the first embodiment and the second embodiment, and therefore such elements will not be further elaborated here. A light-emitting module 10A according to the embodiment differs from the light-emitting module 10 according to the first embodiment in that the light-emitting elements 30 are connected in parallel.

Figure 19:
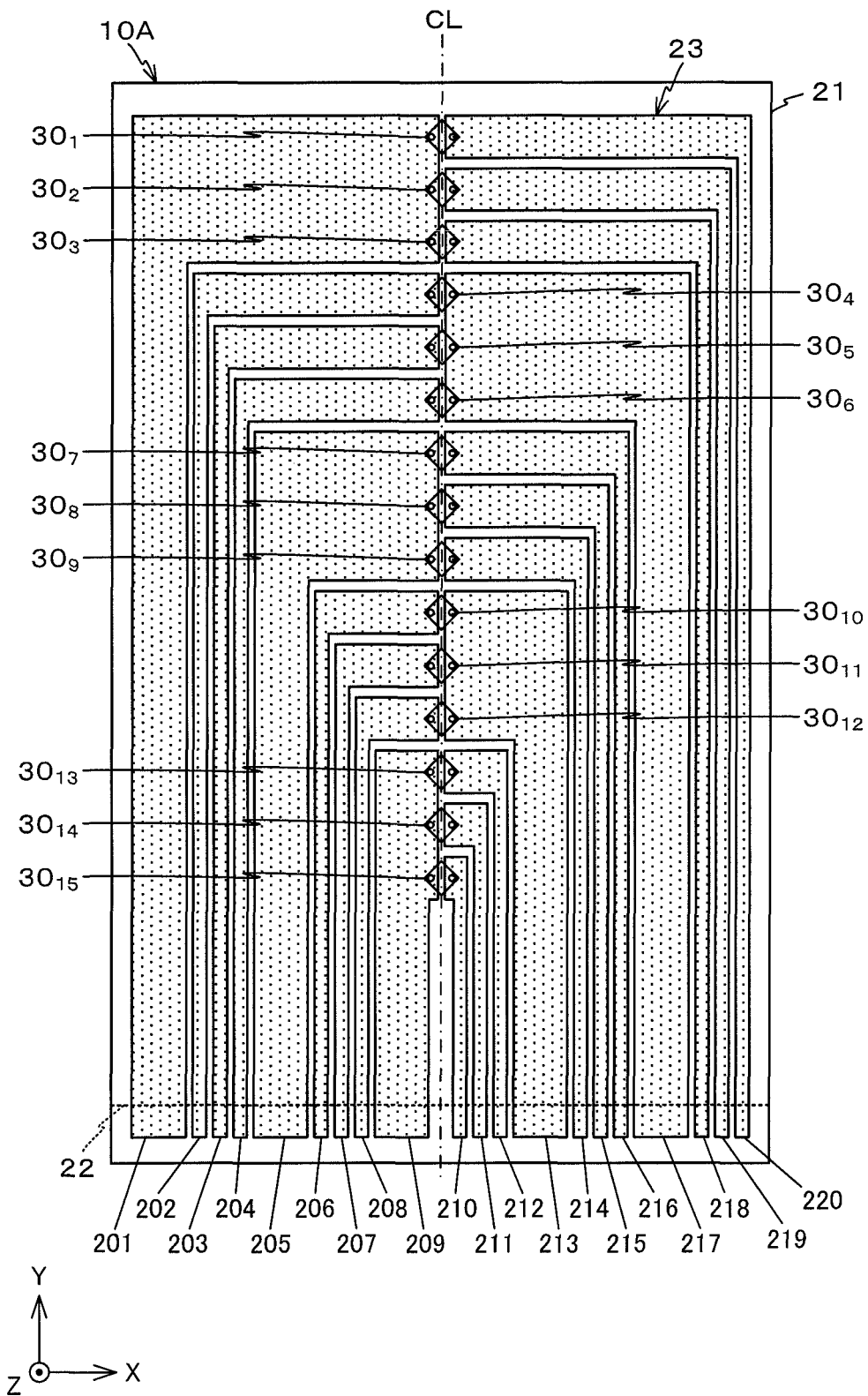
FIG. 19 is a plan view of a light-emitting module according to a second embodiment.

FIG. 19 is a plan view of the light-emitting module 10A according to the embodiment. As illustrated in FIG. 19, the light-emitting module 10A is a module having the longitudinal direction in the Y-axis direction. This light-emitting module 10A includes 15 pieces of light-emitting elements $30_1$ to $30_{15}$ as a light source.

As apparent with reference to FIG. 3, the light-emitting module 10A includes one set of the light transmissive films 21 and 22, the resin layer 24 formed between the light transmissive films 21 and 22, and the 15 pieces of the light-emitting elements $30_1$ to $30_{15}$ disposed inside the resin layer 24.

Among one set of the light transmissive films 21 and 22, the conductor layer 23 with the thickness of around 0.05 µm to 10 µm is formed on the lower surface of the light transmissive film 21. As illustrated in FIG. 19, the conductor layer 23 is constituted of a plurality of mesh patterns 201 to 220. The mesh patterns 201 to 220 are each made of a metallic material such as the copper (Cu) and the argentum (Ag).

The respective mesh patterns 201 to 220 are shaped in an L shape. The mesh pattern 201 is disposed at a region on the left side (the −X-side) of the light transmissive film 21 along the outer edge on the −X-side of the light transmissive film 21. The mesh patterns 202 to 209 are disposed in order from this mesh pattern 201 to the inside. The mesh pattern 220 is disposed at a region on the right side (the +X-side) of the light transmissive film 21 along the outer edge on the +X-side of the light transmissive film 21. The mesh patterns 219 to 210 are disposed in order from this mesh pattern 201 to the inside.

In the light-emitting module 10A, the mesh pattern 201 is opposed to the mesh patterns 218 to 220 so as to interpose a center line CL passing through the center of the light transmissive film 21 and parallel to the Y-axis. Similarly, the mesh patterns 202 to 204 are opposed to the mesh pattern 217, the mesh pattern 205 is opposed to the mesh patterns 214 to 216, the mesh patterns 206 to 208 are opposed to the mesh patterns 213, and the mesh pattern 209 is opposed to mesh patterns 210 to 212.

15 pieces of the light-emitting elements $30_1$ to $30_{15}$ are disposed at regular intervals on the center line CL and are disposed across one set of the mesh patterns mutually opposed via the center line CL. In view of this, configuring the mesh pattern 201 as a common pattern, the light-emitting elements $30_1$ to $30_3$ and the mesh patterns 218 to 220 are mutually connected in parallel. Hereinafter, similarly, configuring the mesh pattern 217 as the common pattern, the light-emitting elements $30_4$ to $30_6$ and the mesh patterns 202 to 204 are mutually connected in parallel. Configuring the mesh pattern 205 as a common pattern, the light-emitting element $30_7$ to $30_9$ and the mesh patterns 214 to 216 are mutually connected in parallel. Configuring the mesh pattern 213 as a common pattern, the light-emitting elements $30_{10}$ to $30_{12}$ and the mesh patterns 206 to 208 are mutually connected in parallel. Configuring the mesh pattern 209 as a common pattern, the light-emitting elements $30_{13}$ to $30_{15}$ and the mesh patterns 210 to 212 are mutually connected in parallel.

As described above, with the light-emitting module 10A according to the embodiment, the respective light-emitting elements $30_1$ to $30_{15}$ are connected in parallel to the mesh patterns 201, 205, 209, 213, and 217 as the common patterns. Accordingly, based on the common patterns, applying predetermined voltages to the respective mesh patterns 202 to 204, 206 to 208, 210 to 212, 214 to 216, and 218 to 220 connected to the respective light-emitting elements $30_1$ to $30_{15}$ allows individually driving the respective light-emitting elements $30_1$ to $30_{15}$.

While the embodiment does not mention an emitted light color of the light-emitting element 30, for example, implementing a light-emitting element 30R, which emits the light in red, a light-emitting element 30G, which emits the light in blue, a light-emitting element 30B, which emits the light in green, and a similar light-emitting element allows the light-emitting module to emit the lights in various colors.

While the embodiment describes the light-emitting module 10A including 15 pieces of the light-emitting elements 30 disposed at the regular intervals, the configuration is not limited to this. By disposing the light-emitting elements 30R, 30G, and 30B close to the extent that the colors of the lights from the respective light-emitting elements 30R, 30G, and 30B are mixed, the light-emitting module may emit the light in neutral tint.

Figure 20:
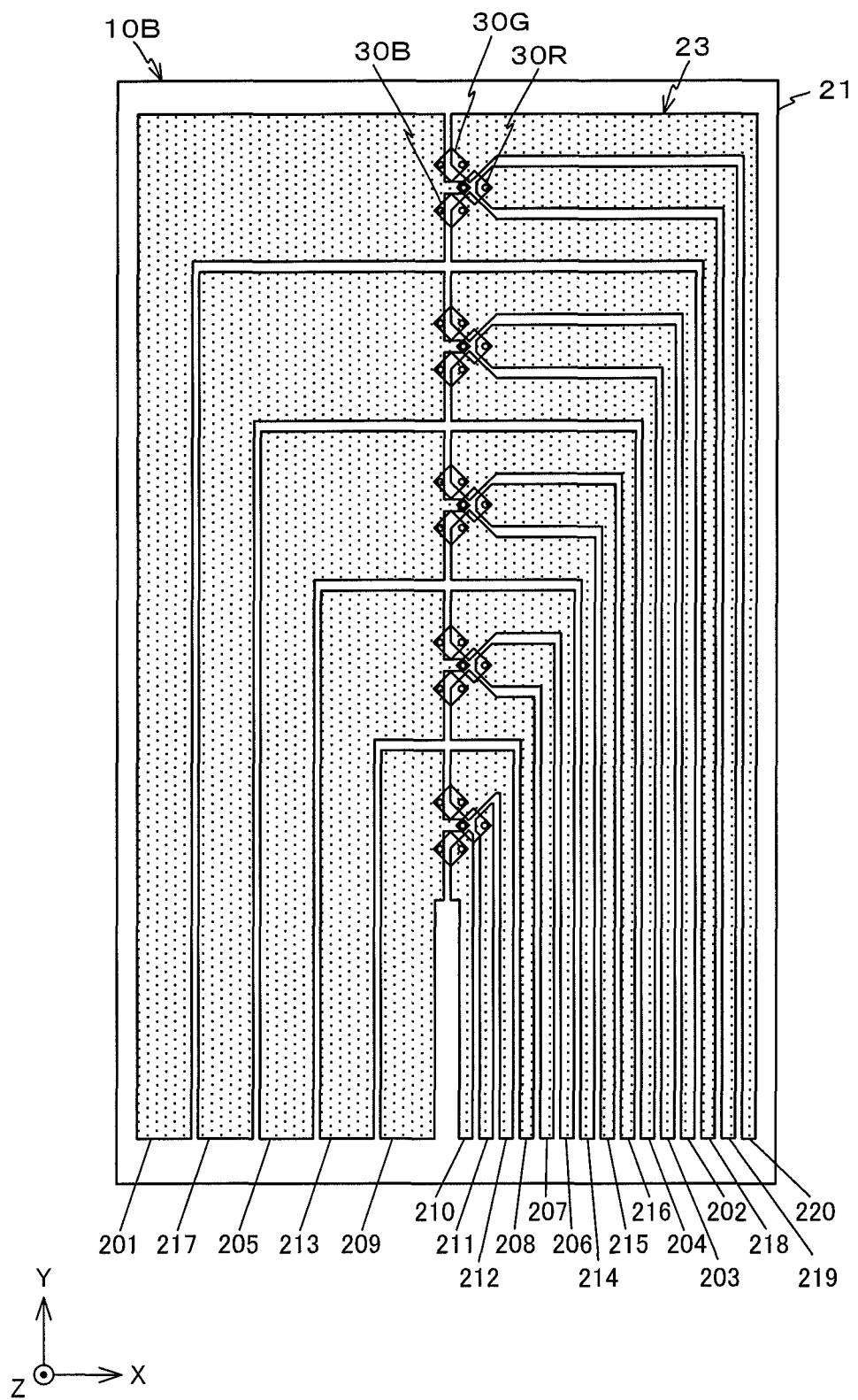
FIG. 20 is a plan view of a light-emitting module according to a modification.

FIG. 20 is a drawing illustrating a light-emitting module 10B using the light-emitting elements 30R, 30G, and 30B disposed close to one another as a light source. As illustrated in FIG. 20, the light-emitting module 10B includes five sets of the light-emitting elements 30R, 30G, and 30B. The light-emitting elements 30R, 30G, and 30B of each set are disposed to have an L-shape. The two light-emitting elements 30G and 30B are disposed so as to be adjacent to the light-emitting element 30R. A distance d between the light-emitting element 30R and the light-emitting element 30G and a distance d between the light-emitting element 30R and the light-emitting element 30B are around 0.15 to 1 mm.

In the light-emitting module 10B, the light-emitting elements 30R, 30G, and 30B each emit the lights in red, blue, and green are disposed close to one another. The respective light-emitting elements 30R, 30G, and 30B can individually emit the lights. In view of this, individually driving the light-emitting elements 30R, 30G, and 30B allows the light-emitting module 10 to emit the lights in red, blue, green, white, and neutral tint.

Figure 21:
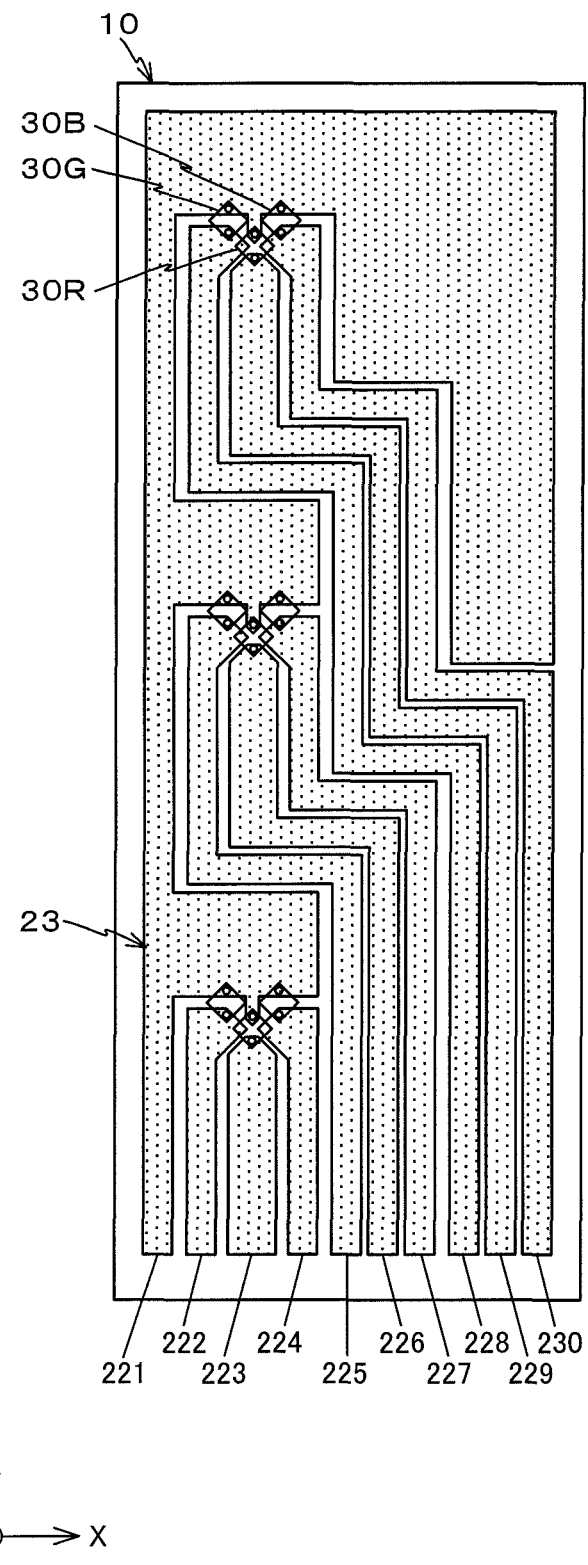
FIG. 21 is a plan view of a light-emitting module according to a modification.

As illustrated in FIG. 19 and FIG. 20, while this embodiment describes the case where the light-emitting module 10 includes the L-shaped mesh patterns 201 to 220, the mesh patterns are not limited to the shape but any given shape can be determined. For example, as illustrated in FIG. 21, the conductor layer 23 may be constituted of a mesh pattern 221 as a common pattern, which is connected to all the light-emitting elements 30R, 30G, and 30B of the light-emitting module 10, rectangular mesh patterns 222 to 224, and mesh patterns 225 to 230, which bend at a plurality of sites.

Third Embodiment

FIG. 22A to 22D are connecting examples of the connecting pad P to the mesh patterns. The connecting examples are applicable to both the first embodiment and the second embodiment.

Figure 22A:
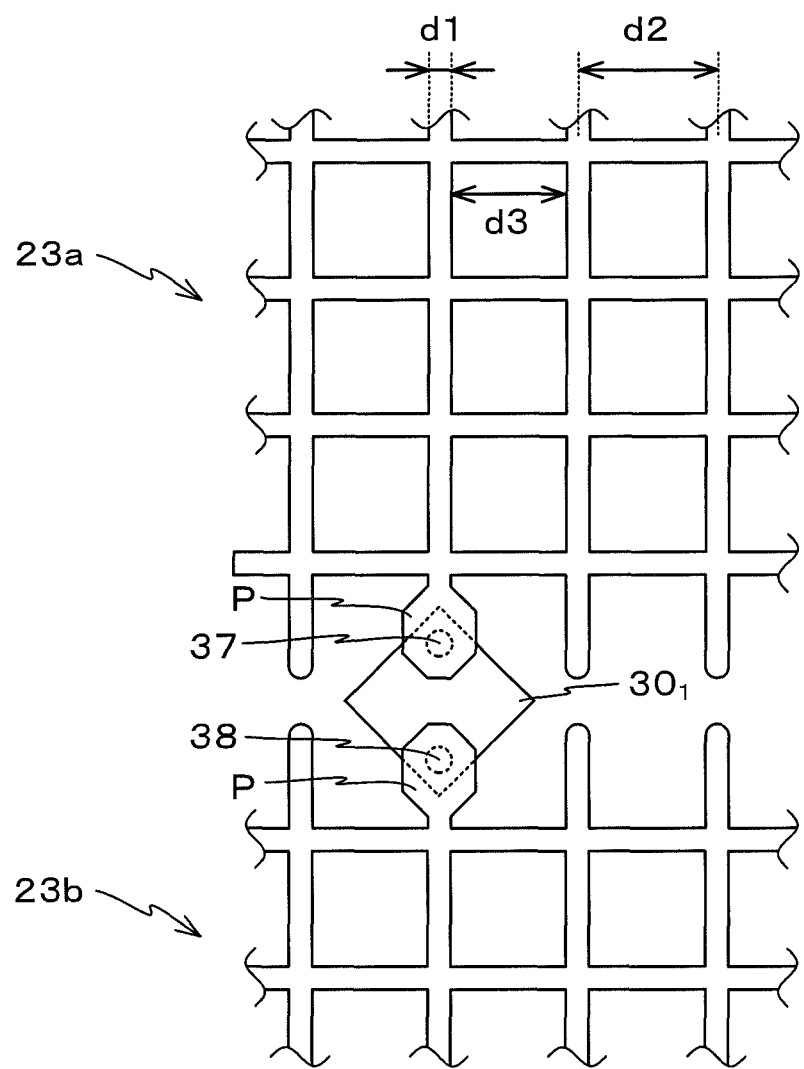
FIG. 22A is a drawing illustrating the enlarged mesh patterns of a light-emitting module according to a third embodiment.
Figure 22B:
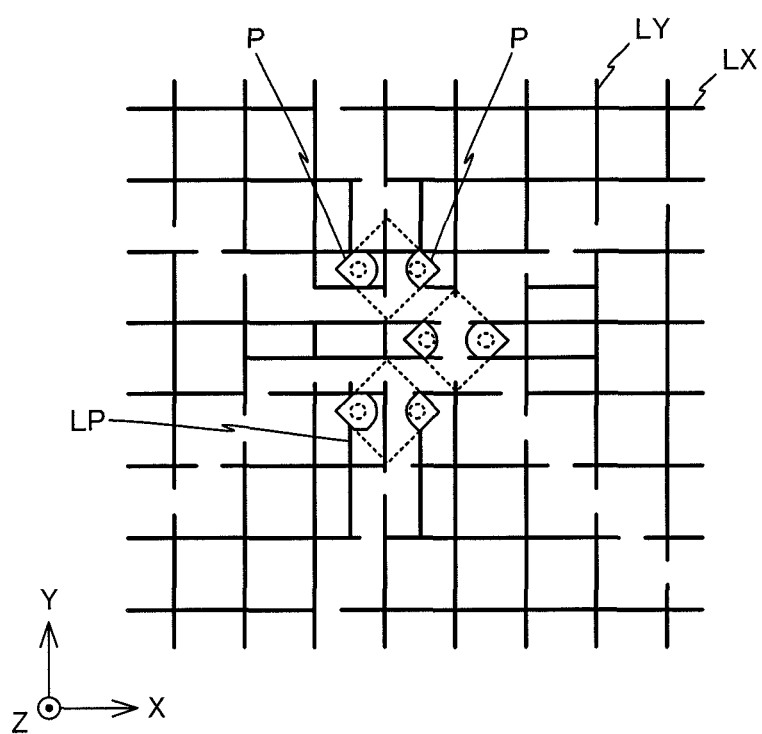
FIG. 22B is a drawing illustrating a modification of the mesh pattern.
Figure 22C:
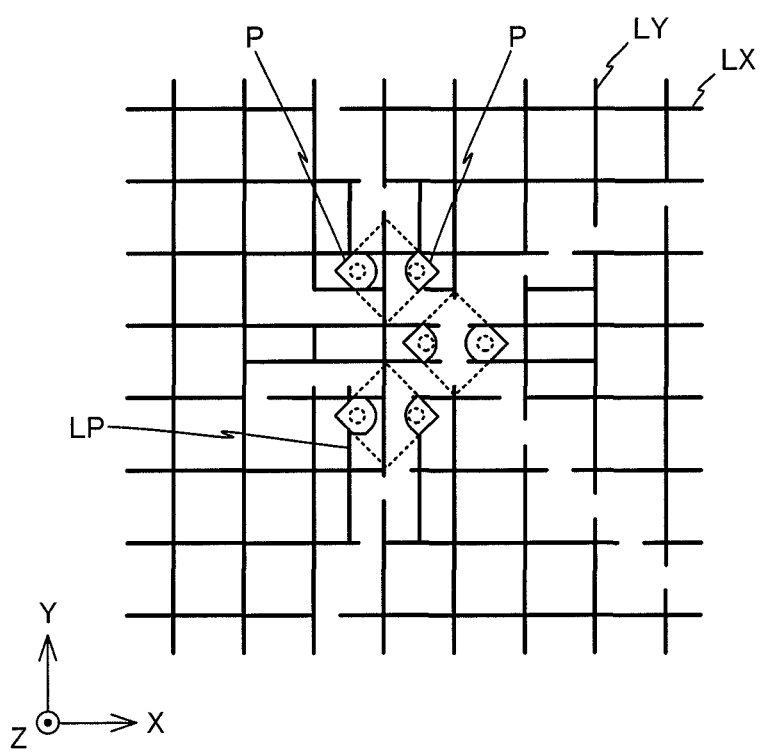
FIG. 22C is a drawing illustrating a modification of the mesh pattern.
Figure 22D:
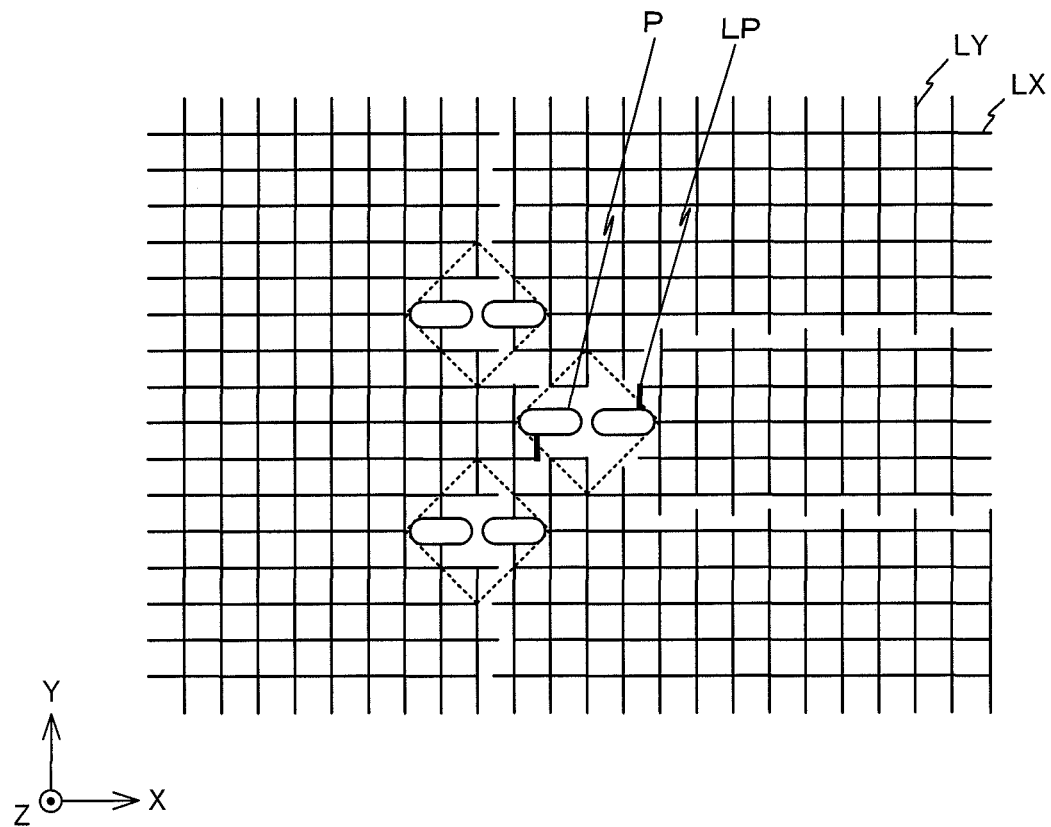
FIG. 22D is a drawing illustrating a modification of the mesh pattern.

FIG. 22A illustrates an example where the connecting pad P is connected to the mesh patterns by one line pattern. FIG. 22B and FIG. 22C are examples of a high-density RGB light-emitting module and are examples where the connecting pads P are connected to two line patterns. FIG. 22B is a drawing illustrating mesh pattern at a peripheral area of the light-emitting module as one example. FIG. 22C is a drawing illustrating mesh pattern at the intermediate portion of the light-emitting module as one example. FIG. 22D is another connecting example of the connecting pads P to the mesh pattern.

In FIG. 22B to FIG. 22D, additional line patterns LP to connect the line patterns LX and LY to the connecting pads P is formed in addition to the existing line patterns LX and LY.

It is preferable for the connecting of the connecting pads P to the mesh patterns to include the line patterns LP such that the number of line patterns directly connected to the connecting pads P becomes two or more. Disposing the additional line patterns LP ensures improving strength of the mesh pattern. Additionally, reliability against a pattern loss due to a process failure caused by dust or a similar matter is enhanced.

Connecting the plurality of line patterns to the connecting pads P allows decreasing currents flowing through the respective line patterns LX and LY. This allows preventing disconnection of the line patterns LX and LY and a similar failure due to overcurrent. Accordingly, if by any chance, even if any of the plurality of line patterns LX and LY is disconnected, the electric power can be continuously supplied to the light-emitting element 30 implemented to the connecting pad P via a good line pattern. Thus, the additional line pattern LP can be disposed as a reinforcing pattern.

Fourth Embodiment

The light-emitting module including the plurality of light-emitting elements possibly has a limit in extension of a power supply line using a one-layer wiring layer. FIG. 23A to FIG. 24B are drawings illustrating examples of a light-emitting module where a wiring of the light-emitting module is multilayered.

To configure a light transmission type light-emitting module into multilayer, it is considered to configure the mesh patterns to be a multilayer, and the respective layers are used as lower-layer wirings and upper-layer wirings.

Figure 23A:
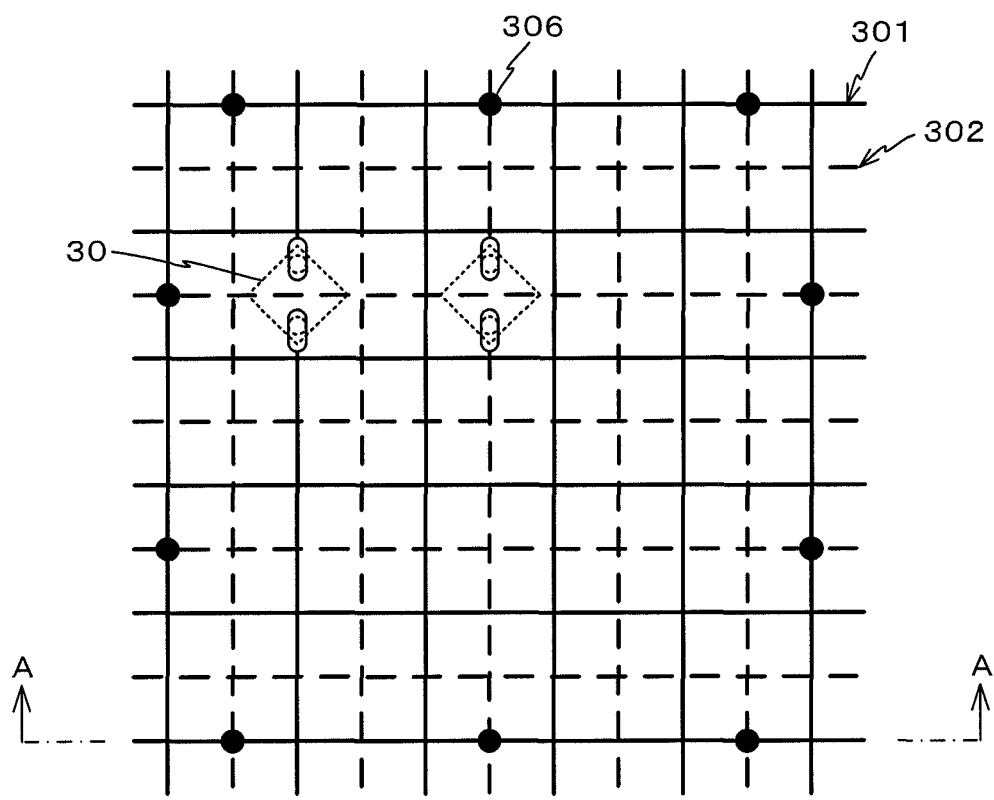
FIG. 23A is a drawing illustrating a wiring example of a light-emitting module according to a fourth embodiment.
Figure 23B:
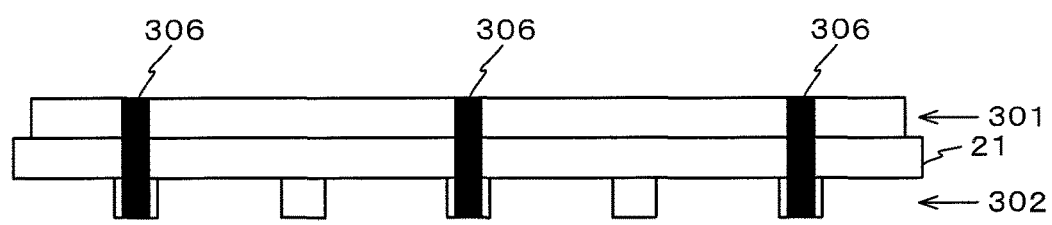
FIG. 23B is a drawing illustrating a wiring example of the light-emitting module.
Figure 23C:
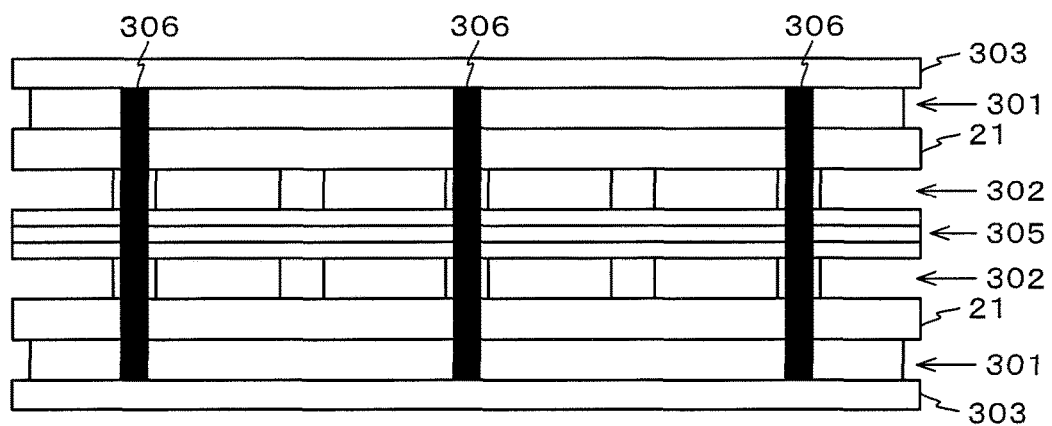
FIG. 23C is a drawing illustrating a wiring example of the light-emitting module.

FIG. 23A to FIG. 23C are drawings describing a light-emitting module including the light transmissive film 21 (the PET film) where mesh patterns 301 and 302 are formed on front and back surfaces. The light-emitting elements can be implemented to the front and back surfaces of the light transmissive film 21. FIG. 23A is a plan view of the light transmissive film 21. FIG. 23B is a cross-sectional view of the light transmissive film 21. FIG. 23C is a drawing illustrating a light-emitting module formed through lamination of the light transmissive films 21. In this light-emitting module, the two light transmissive films 21 are disposed between one set of light transmissive films 303. The light transmissive films 21 are mutually laminated via an adhesive layer 305.

As illustrated in FIG. 23A, the mesh patterns 301 and 302 formed on the light transmissive film 21 are indicated by respective solid lines and dashed lines. The line patterns of the mesh patterns 301 and 302 are displaced by a ½ pitch from one another. Connecting portions 306 are disposed at sites where the mesh patterns 301 and 302 overlap. The connecting portion 306 can be formed by, for example, disposing a through-hole on the light transmissive film 21, filling this through-hole with a conductive paste, and performing plating. The mesh patterns 301 and 302 are electrically connected by the connecting portions 306.

Similar to the first to the third embodiments, the light-emitting element such as the LED is connected to one of the mesh patterns among the mesh patterns 301 and 302 on the light transmissive films 21. In the case where a space is formed between the light transmissive films, this space is filled with a resin. Black circles in FIG. 23A indicate sites where the connecting portions 306 or the mutual mesh patterns 301 and 302 can be connected. The mesh patterns 301 and 302 on the upper side and the lower side are each processed into a desired wiring shape. Light-emitting elements such as the LEDs may be separately connected to the mesh patterns 301 and 302 on both the front and back surfaces of the light transmissive film 21. That is, a first light-emitting element may be connected to one of the front and the back of the mesh pattern 301, and a second light-emitting element may be connected to the other front or back of the mesh pattern 302.

Figure 24A:
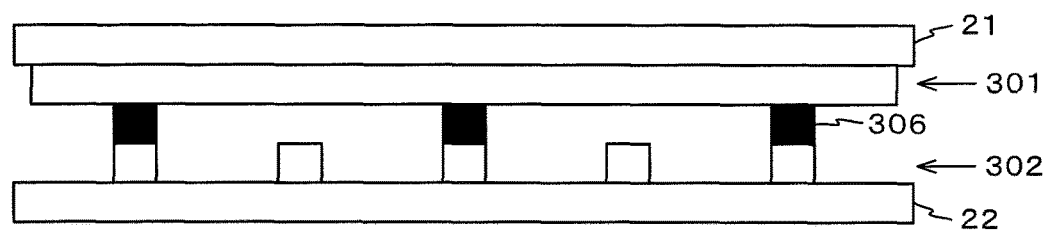
FIG. 24A is a drawing illustrating a wiring example of the light-emitting module.
Figure 24B:
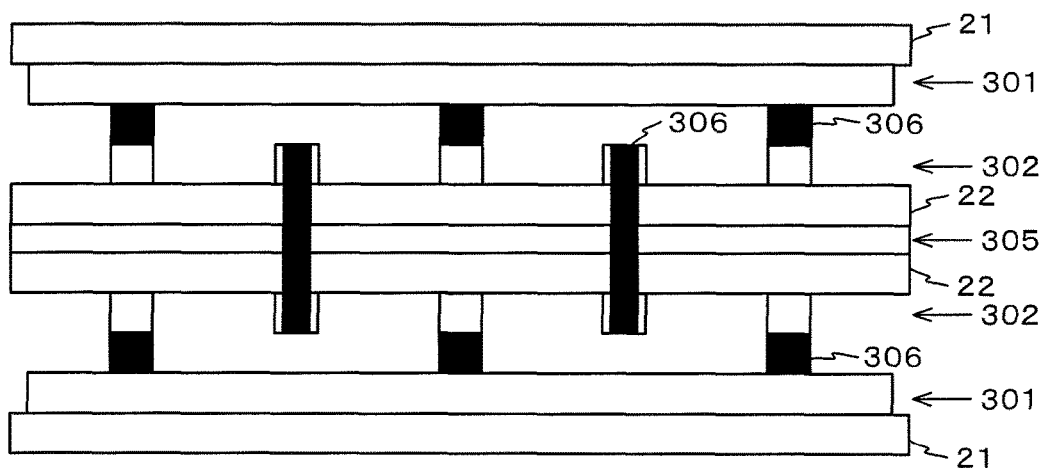
FIG. 24B is a drawing illustrating a wiring example of the light-emitting module.

FIG. 24A is a cross-sectional view illustrating the light transmissive film 21 (the PET film) where the mesh pattern 301 is formed and the light transmissive film 22 (the PET film) where the mesh pattern 302 is formed. The mesh patterns 301 and 302 are formed at the respective opposed surfaces of the light transmissive films 21 and 22.

As apparent with reference to FIG. 23A, the mesh patterns 301 and 302 are indicated by the respective solid lines and dashed lines. The line patterns of the mesh patterns 301 and 302 are displaced by a ½ pitch from one another. The connecting portions 306 are disposed at sites where the mesh patterns 301 and 302 overlap to connect the mesh patterns 301 and 302.

Similar to the first to the third embodiments, the light-emitting elements are connected to the mesh patterns 301 and 302 on the light transmissive films 21 and 22. A space between the light transmissive films 21 and 22 is filled with the resin. The mesh patterns 301 and 302 are connected using, for example, 0Ω resistance or a dummy chip. After the mesh patterns 301 and 302 are extracted from the space between the light transmissive films 21 and 22, the mesh patterns 301 and 302 may be connected to one another. While the light-emitting elements such as the LEDs are connected to one of the mesh patterns 301 and 302, the light-emitting elements such as the LEDs may be separately connected to both the mesh patterns 301 and 302 as desired. That is, the first light-emitting element may be connected to the mesh pattern 301 and the second light-emitting element may be connected to the mesh pattern 302.

As the light-emitting element of this example, in addition to the light-emitting element of one surface with two electrodes type, which is described in the first to the third embodiments, a light-emitting element of electrode-on both-surfaces type, which has electrodes on both surfaces, is also applicable. In the case of the use of the light-emitting element of the electrode-on both-surfaces type, one electrode is connected to the mesh pattern 301 and the other electrode is connected to the mesh pattern 302.

It is also possible that one conductor layer of multilayer wiring is constituted of a mesh pattern and the other is constituted of a light transmissive conductive film such as an ITO. It is also possible that the multilayer wiring part is disposed only at the peripheral portion of the light-emitting module and a base wiring pattern such as the mesh pattern to which the light-emitting element is connected itself is configured to have a multilayer wiring structure.

Fifth Embodiment

Figure 25A:
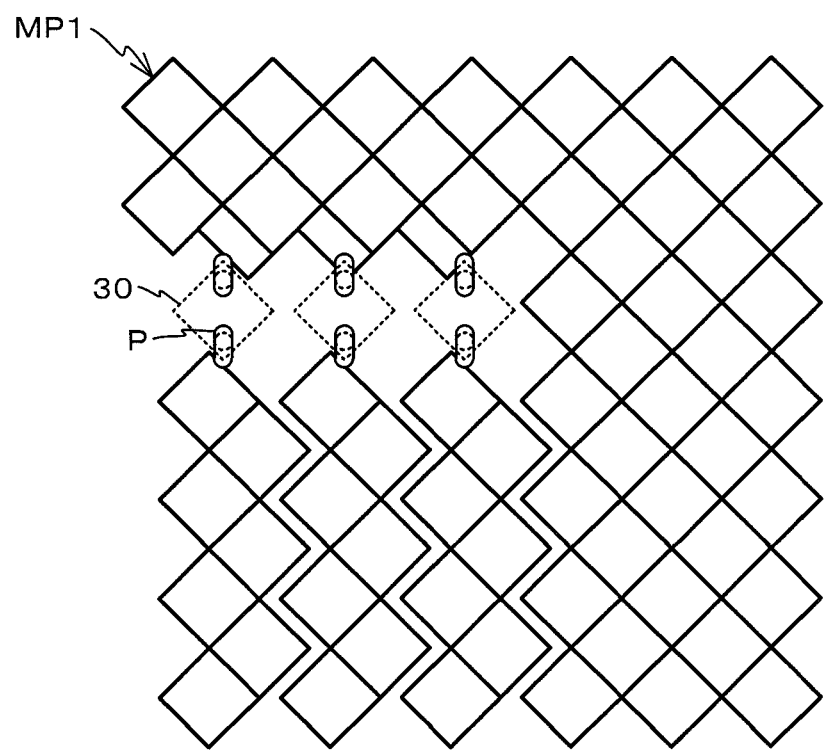
FIG. 25A is a plan view illustrating an example of a mesh pattern of a light-emitting module according to a fifth embodiment.
Figure 25B:
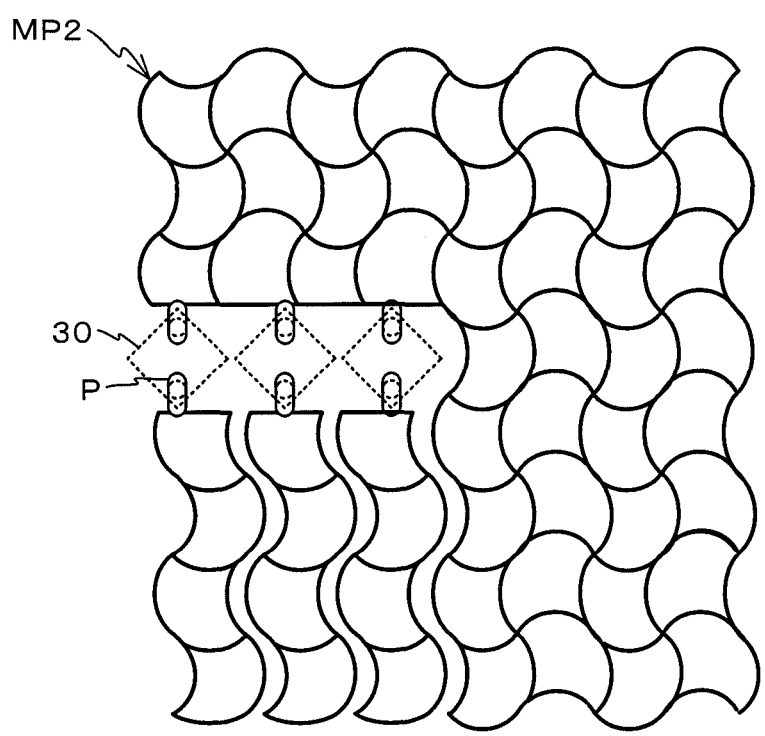
FIG. 25B is a plan view illustrating a mesh pattern of the light-emitting module.
Figure 25C:
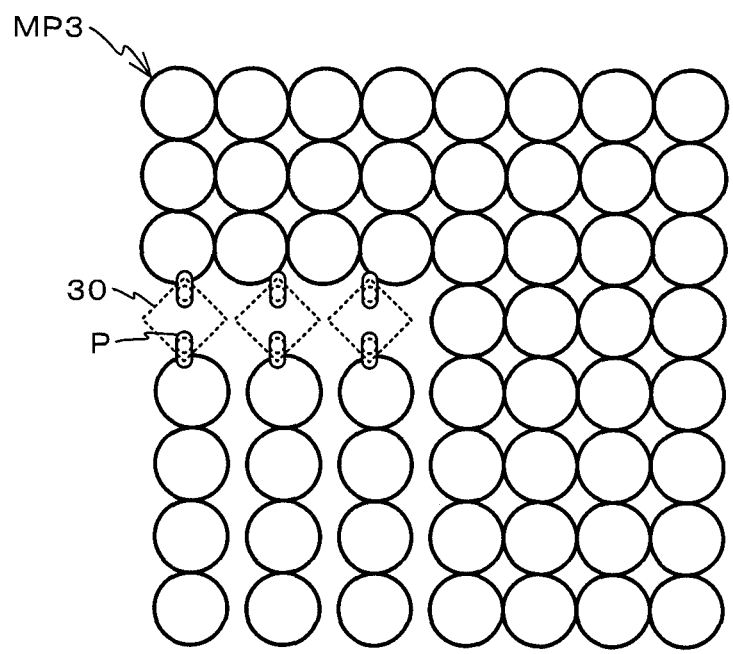
FIG. 25C is a plan view illustrating a mesh pattern of the light-emitting module.
Figure 25D:
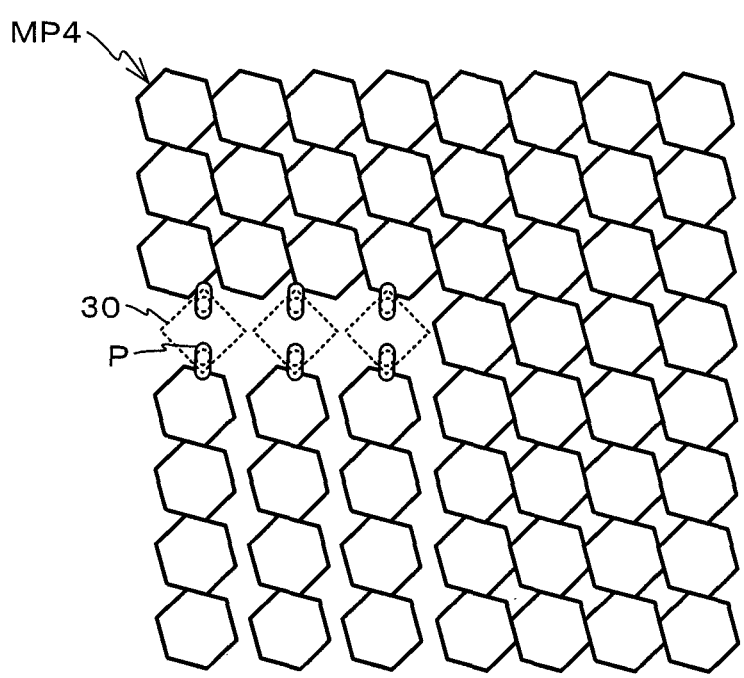
FIG. 25D is a plan view illustrating a mesh pattern of the light-emitting module.
Figure 25E:
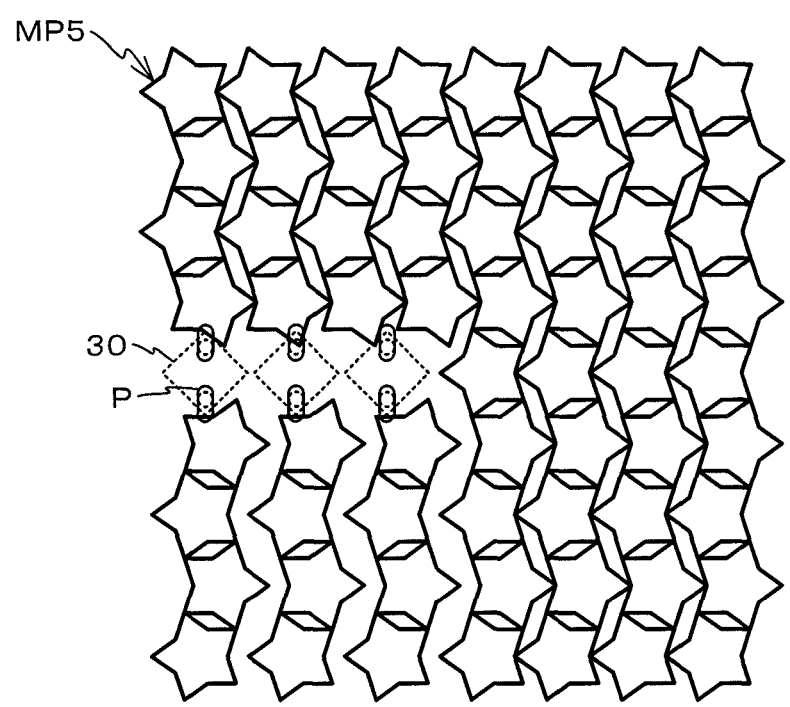
FIG. 25E is a plan view illustrating a mesh pattern of the light-emitting module.
Figure 25F:
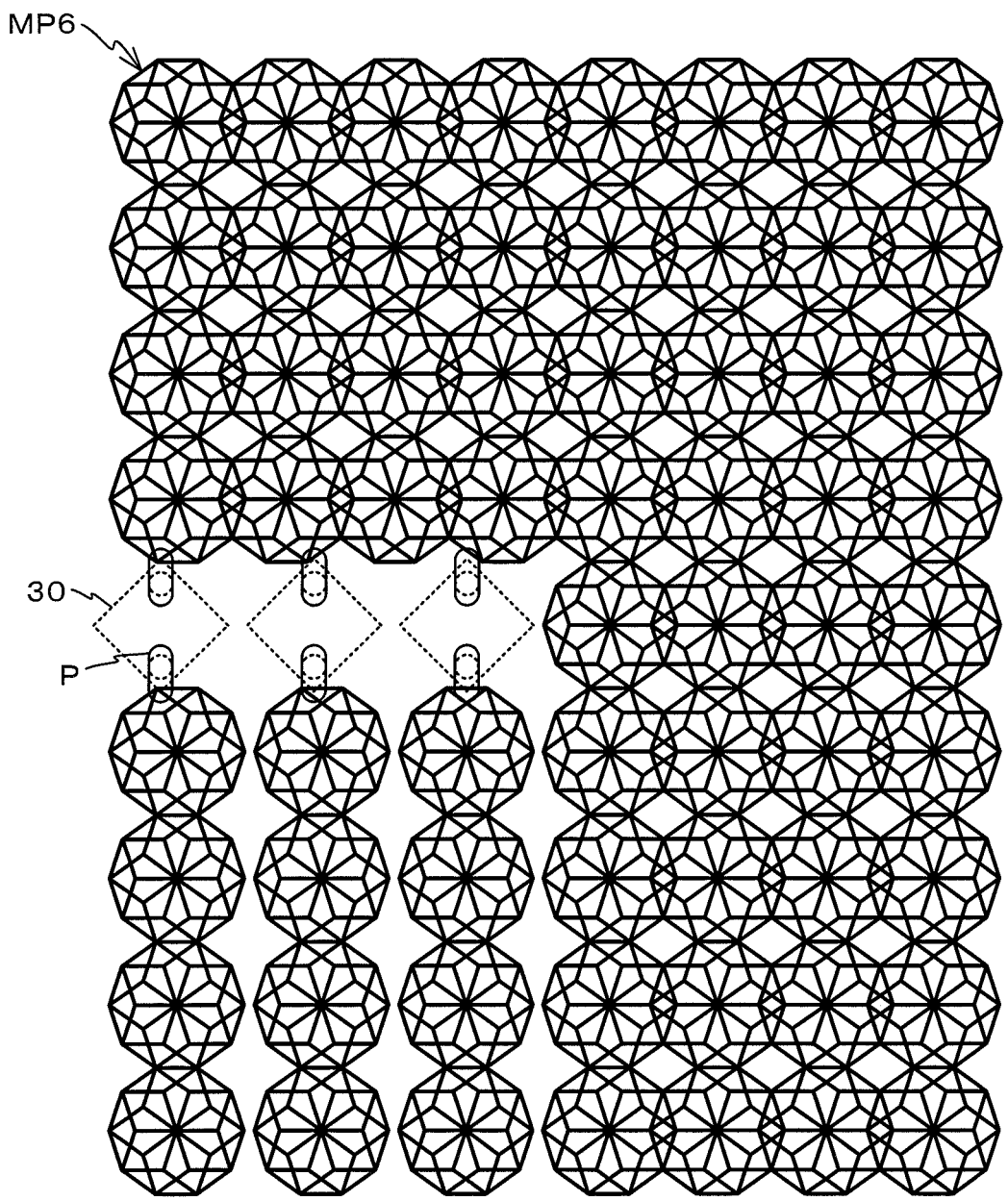
FIG. 25F is a plan view illustrating a mesh pattern of the light-emitting module.

FIG. 25A to FIG. 25F are drawings illustrating examples of other mesh patterns. FIG. 25A illustrates a mesh pattern MP1 where line patterns are inclines by 45°. FIG. 25B illustrates a mesh pattern MP2 where line patterns are formed of curved lines. FIG. 25C illustrates a mesh pattern MP3 where line patterns form circles. FIG. 25D, FIG. 25E, and FIG. 25F illustrate mesh patterns MP4, MP5, and MP6 where line patterns have polygonal shapes.

The light-emitting modules according to the first to the fourth embodiments can be used for applications such as a display, a decoration, and an illumination. However, in the case where a grid pattern such as a stripe and a mesh is present close to the mesh pattern that the light-emitting module has, a moire possibly occurs between both. Hereinafter, for convenience of explanation, the mesh pattern, the grid pattern, and a similar pattern constituted of the high transmittance part and the low transmittance part are referred to as a grid pattern for convenience.

For example, in the case where the light-emitting modules of the first to the fourth embodiments are used as a backlight for a liquid crystal display device in close contact with a liquid crystal display, a displacement of pitches with a pixel array of the opposite side possibly results in the moire. The mesh pattern MP1 illustrated in FIG. 25A inclines the line patterns on the light-emitting module side by 45° with respect to the grid pattern of the target such as the stripe and the mesh. The mesh pattern MP1 is, for example, formed in a state inclined with respect to a side of a square or rectangular light-emitting panel by 45 degrees. Thus, inclining the line patterns of the mesh pattern MP1 with respect to the target such as the liquid crystal display ensures preventing the moire.

With the mesh pattern MP2 illustrated in FIG. 25B where the line patterns are formed into the curved lines and the mesh pattern MP3 illustrated in FIG. 25C where the line patterns form the circles, the line patterns and the grid pattern of the target do not linearly intersect with one another, thereby bringing an effect of preventing the moire. Additionally, the mesh patterns MP4, MP5, and MP6 illustrated in FIG. 25D, FIG. 25E, and FIG. 26F where the respective line patterns have the polygonal shapes (excluding the square shapes) generate a diagonal component in the line patterns, thereby also bringing the effect of preventing the moire.

While the examples of the mesh pattern where the light-emitting module is applied as the backlight for the liquid crystal display device are described above, in the case where the two mesh patterns on the upper and the lower sides are present in the light-emitting module like the fourth embodiment, the mesh patterns according to FIG. 25A to FIG. 25F are applicable.

In the case where the mesh pattern illustrated in FIG. 25A is used, it is only necessary that the line patterns of the one mesh pattern among the two mesh patterns on the upper and the lower sides are inclined with respect to the line patterns of the other mesh pattern by 45°. In the case where the mesh patterns illustrated in FIG. 25B to FIG. 25F are used, it is only necessary to combine the mesh patterns as necessary for application. For example, the one mesh pattern is configured as a pattern formed of a regular tetragon and the other mesh pattern is configured to be any one of the mesh patterns illustrated in FIG. 25B to FIG. 25F. It is also possible to combine the mesh patterns illustrated in FIG. 25B to FIG. 25F.

Sixth Embodiment

Figure 26:
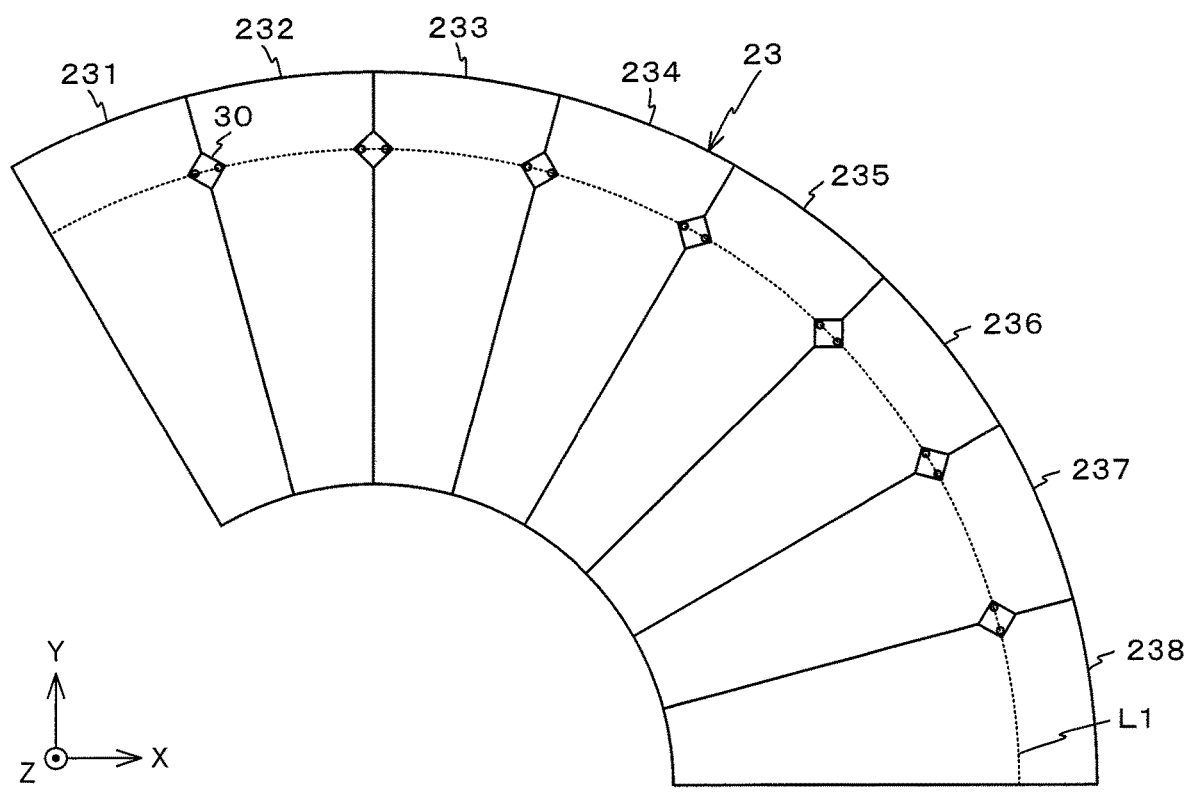
FIG. 26 is a plan view of mesh patterns according to a six embodiment.

While the embodiments of the present disclosure are described above, the present disclosure is not limited to the embodiments. For example, while the embodiment describes the case where the light-emitting element 30 is disposed on the center line CL, the configuration is not limited to this. For example, as illustrated in FIG. 26, the light-emitting elements 30 may be disposed on a curved line L1. FIG. 26 is a drawing developing a part of a cone in a planar surface. This light-emitting module has a curved surface in a finished state (an assembled state), and light-emitting elements are arranged in a straight line at the peripheral area of the cone.

In this case, it is considered that mesh patterns 231 to 238 constituting the conductor layer 23 are formed into a fan shape having a pair of outer edges perpendicular to the curved line L1. Forming the mesh patterns 231 to 238 into the fan shape allows the sizes and the shapes of the respective mesh patterns 231 to 238 to be uniform. This makes current densities of the respective mesh patterns 231 to 238 constant, ensuring reducing heat generation and a frequency of disconnection of the line patterns LX and LY.

Figure 27:
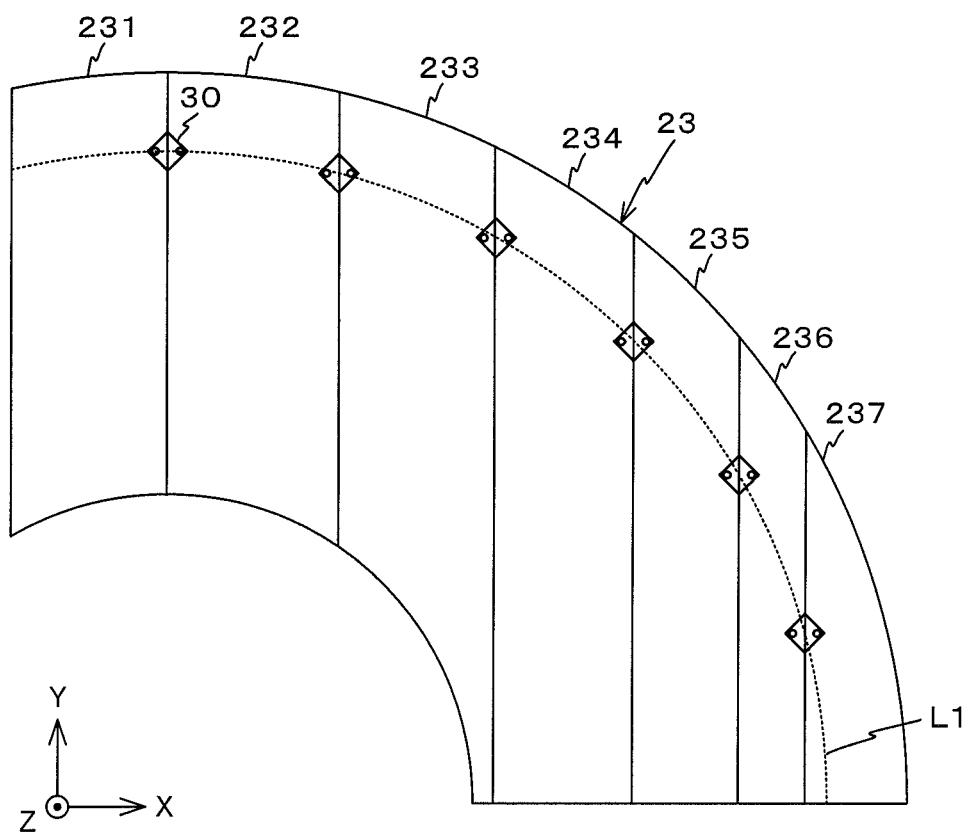
FIG. 27 is a plan view of mesh patterns.

The shape of the mesh patterns 231 to 238 constituting the conductor layer 23 is not the fan shape but may be, for example, a strip shape as illustrated in FIG. 27 having outer edges parallel to one another. In this case, the shapes and the sizes of the mesh patterns 231 to 238 possibly differ from one another depending on the shape of the conductor layer 23. However, since the outer edges of the mesh patterns 231 to 238 are parallel to one another, these light-emitting elements 30 can be connected to the mesh patterns 231 to 238 without changing the degree of the light-emitting element 30. Accordingly, to implement the light-emitting elements 30 using, for example, a mounter, the positioning of the light-emitting elements 30 to the mesh patterns 231 to 238 is facilitated.

In FIG. 26 and FIG. 27, the conductor layer 23 is constituted of the mesh patterns. However, the configuration is not limited to the mesh pattern, and a configuration where the conductor layer 23 is constituted of the light transmissive conductive films such as the ITOs is also applicable. A slit between the mesh patterns and the ITO patterns may be a straight line shape or may be the zigzag shape exemplified in the first embodiment.

Seventh Embodiment

Figure 28:
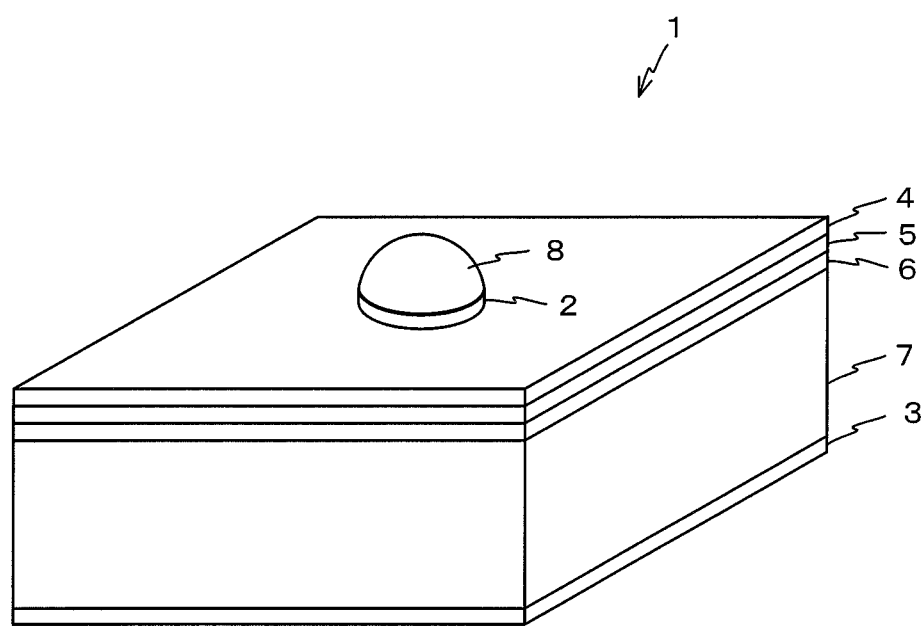
FIG. 28 is a perspective view of a light-emitting element.

While the embodiments use the one surface with two electrodes type as the light-emitting element, as one example, a light-emitting element 1 of the electrode-on both-surfaces type illustrated in FIG. 28 is also usable as necessary. The light-emitting element 1 is a square LED chip with one side of 0.3 mm to 3 mm. As illustrated in FIG. 28, the light-emitting element 1 includes a base material 7, a P-type semiconductor layer 4, which is laminated on the top surface of the base material 7, a light-emitting layer (a PN bonded interface or a light-emitting site with double hetero-connecting structure or a multiple quantum well structure) 5, and a N-type semiconductor layer 6. The positions of the P-type semiconductor layer 4 and the N-type semiconductor layer 6 may be inversed. A pad 2 is disposed on the top surface of the P-type semiconductor layer 4 and a pad 3 is disposed on the lower surface of the base material 7. A bump 8 is disposed on the pad 2.

Figure 29:
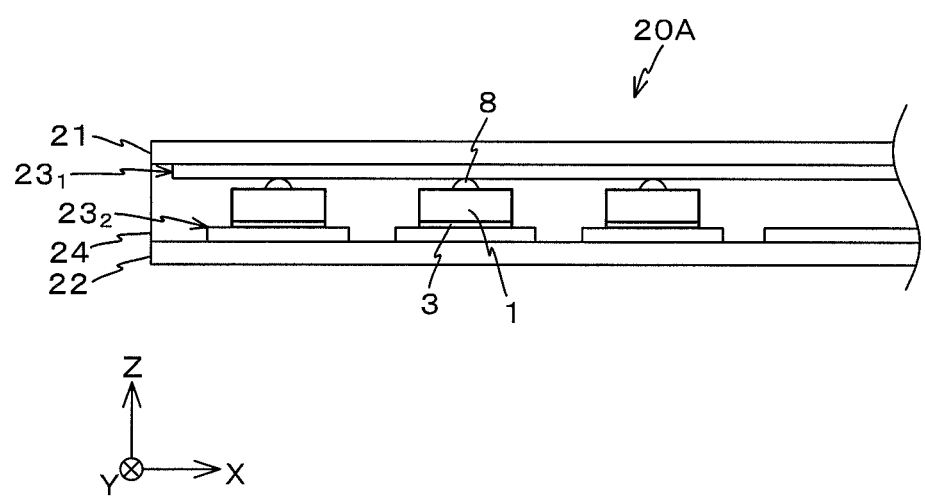
FIG. 29 is a side view of a light-emitting panel.

FIG. 29 is a side view of a light-emitting panel 20A including the light-emitting element 1. The light-emitting panel 20A includes conductor layers $23_1$ and $23_2$ on both the light transmissive films 21 and 22. For example, the bump 8 is connected to the conductor layer $23_1$ via the connecting pad P and the pad 3 is connected to the conductor layer $23_2$.

Figure 30A:
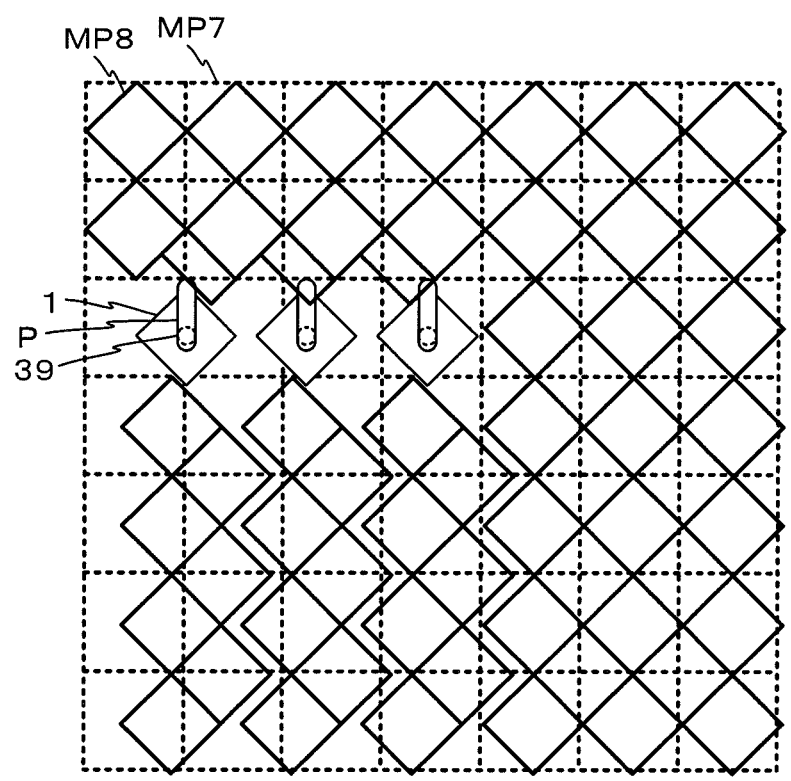
FIG. 30A is a plan view illustrating a mesh pattern of a light-emitting module.

FIG. 30A illustrates a mesh pattern MP8 constituting the conductor layer $23_1$ and a mesh pattern MP7 constituting the conductor layer $23_2$. As illustrated in FIG. 30A, line patterns of the mesh pattern MP7 and line patterns of the mesh pattern MP8 mutually form an angle of 45 degrees. This reduces the moire between the mesh pattern MP7 and the mesh pattern MP8.

Figure 30B:
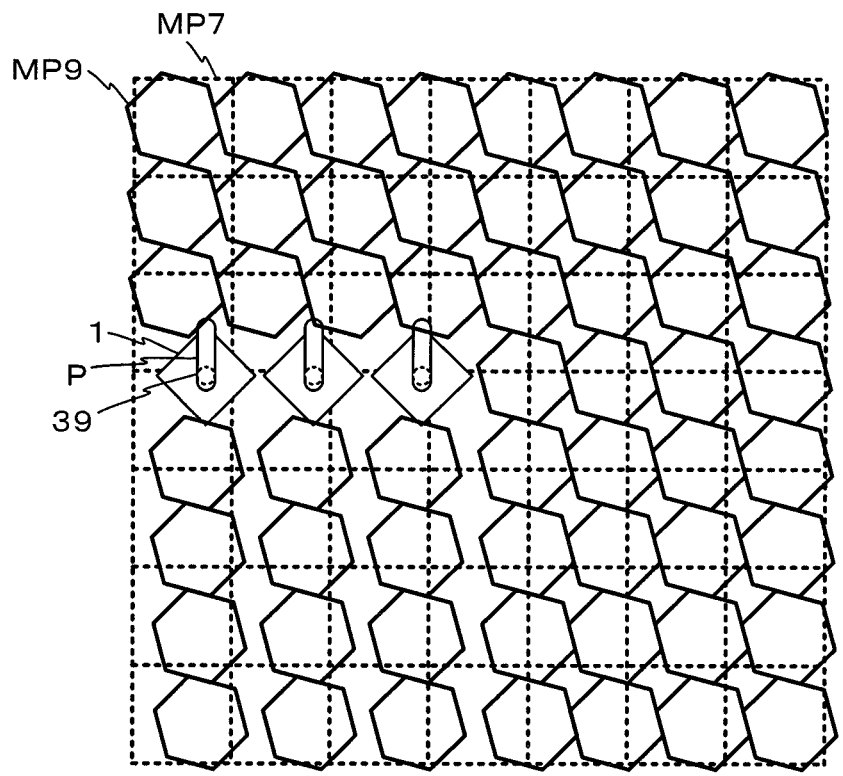
FIG. 30B is a plan view illustrating a mesh pattern of the light-emitting module.
Figure 30C:
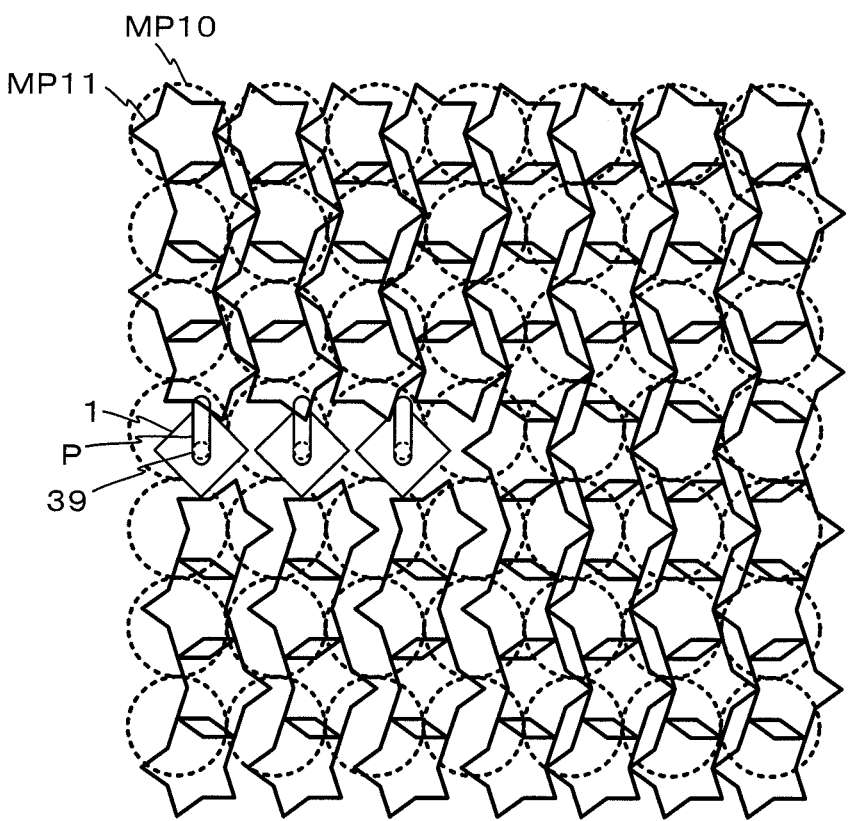
FIG. 30C is a plan view illustrating a mesh pattern of the light-emitting module.

Various kinds of combinations are considered as combinations of the mesh pattern of the conductor layer $23_1$ and the mesh pattern of the conductor layer $23_2$. For example, like a mesh pattern MP9 illustrated in FIG. 30B, the mesh pattern constituting the conductor layer $23_1$ may be configured as a mesh pattern whose line patterns constitute the polygonal shapes. For example, like a mesh pattern MP11 illustrated in FIG. 30C, a mesh pattern whose line patterns constitute the polygonal shape is formed at the conductor layer $23_1$, and like a mesh pattern MP10, a mesh pattern whose line patterns form the curved lines may be formed at the conductor layer $23_2$. In such case as well, the moire can be reduced between the mesh patterns of the respective conductor layers $23_1$ and $23_2$.

The first embodiment to the seventh embodiment are described in detail above. As described using FIG. 11 and FIG. 12, the embodiments mainly describe the case where the conductor layer 23 is cut using the laser to form the mesh patterns 23a to 23i. However, the configuration is not limited to this. The mesh patterns 23a to 23i may be formed by photolithography, inkjet application, screen-printing, and gravure printing.

As described in FIG. 15 and FIG. 16, while the embodiments describe the case where the resin layer 24 is made of the thermoplastic resin 240, the configuration is not limited to this. The resin layer 24 may be made of a resin with a thermosetting property or a combination of these resins. A resin layer may be left or may be removed between the back surface of the light-emitting element and the light transmissive film.

While embodiments describe that the mesh pattern is made of the copper or the argentum, the configuration is not limited to this. The mesh pattern may be made of a metal such as a gold (Au) and a platinum (Pt).

The embodiments form the connecting pad P mainly as a wide-width portion of the mesh pattern. While the connecting pad P is generally a wide width extending portion of the mesh pattern, one where a wide-width portion is disposed at an intersection point of a grid to form a connecting pad, one where a grid is embedded to form a connecting pad, and one where a mesh is thickened at a peripheral area of a LED chip for connecting to the LED on a grid are also included in the concept. The embodiments also permit connecting at a side and an intersection point of the usual grid. The embodiments also permit a constitution of a connecting pad by a metal layer at a different layer from a mesh pattern.

Figure 31A:
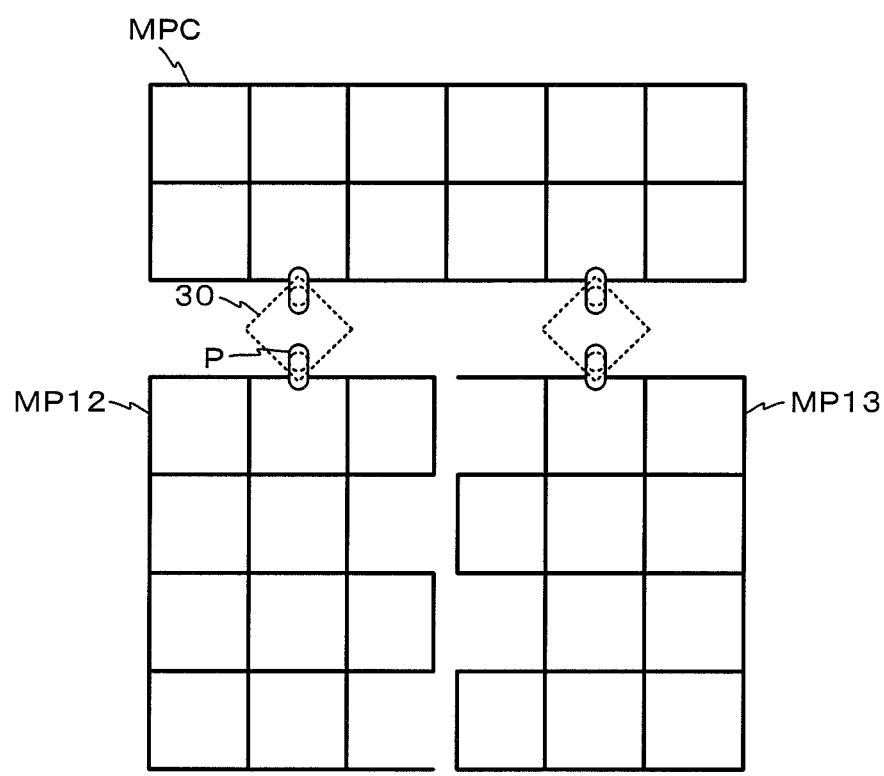
FIG. 31A is a plan view illustrating line patterns.
Figure 31B:
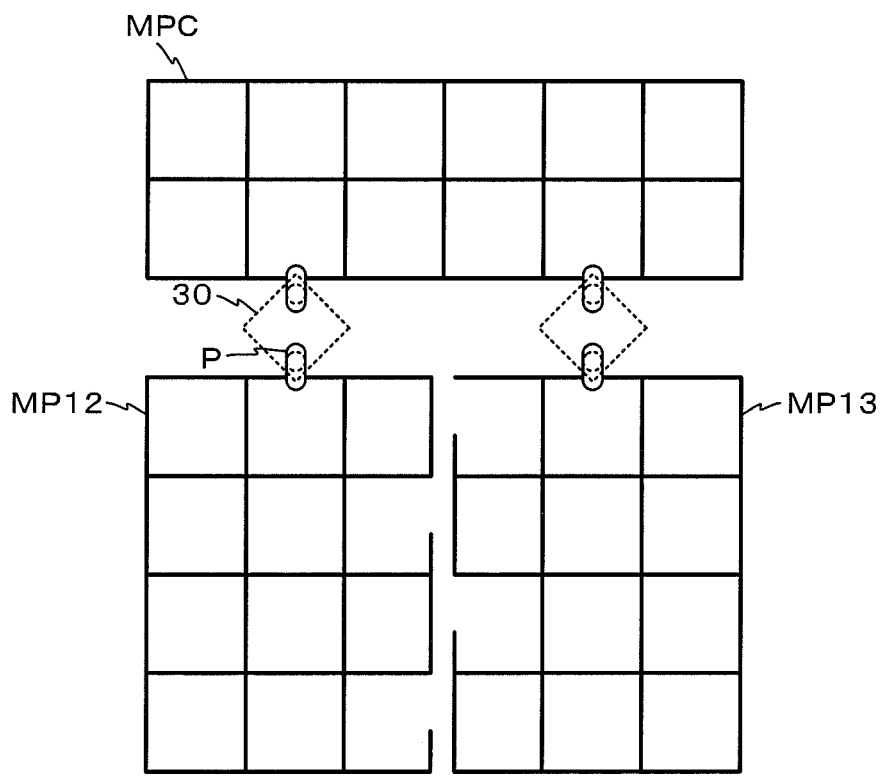
FIG. 31B is a plan view illustrating line patterns.

In the case where the pitch of the line patterns constituting the mesh pattern according to the embodiments is not the equal pitch, it is considered that the degree of light transmissive property of the light-emitting panel varies. For example, as illustrated in FIG. 31A and FIG. 31B, in the case where a distance between two mesh patterns MP12 and MP13 adjacent to a mesh pattern MPC is smaller than a pitch of line patterns constituting the respective mesh patterns, the degree of light transmissive property is deteriorated at a boundary between the mesh pattern MP12 and the mesh pattern MP13. In such case, as illustrated in FIG. 31A and FIG. 31B, partially thinning out the line patterns of the mesh patterns MP12 and MP13 ensures reducing the variation of the degree of light transmissive property of the light-emitting panel.

Figure 31C:
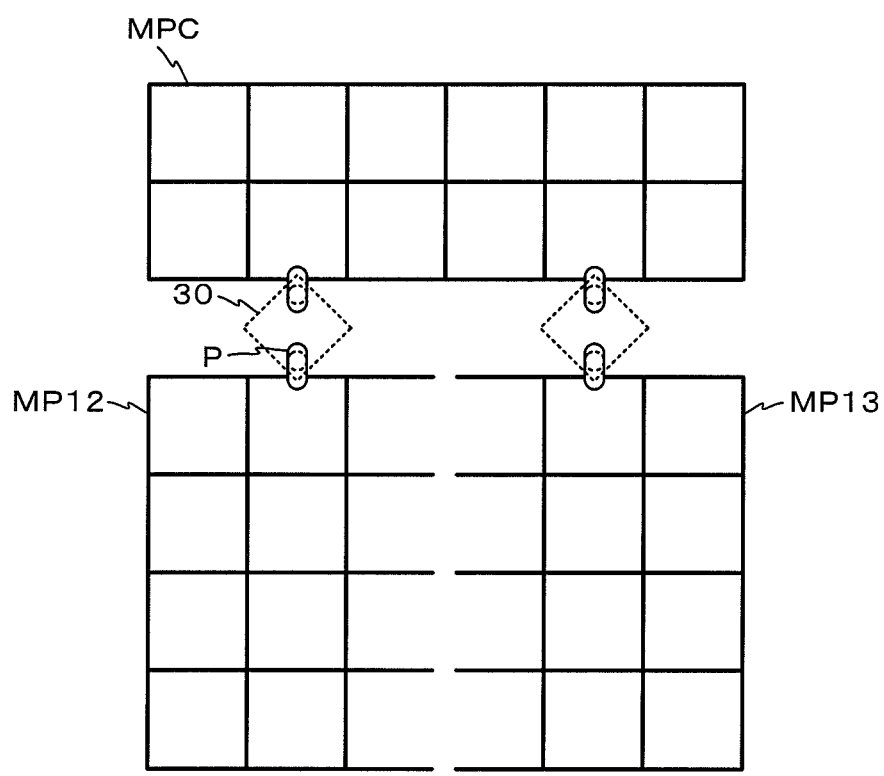
FIG. 31C is a plan view illustrating line patterns.
Figure 31D:
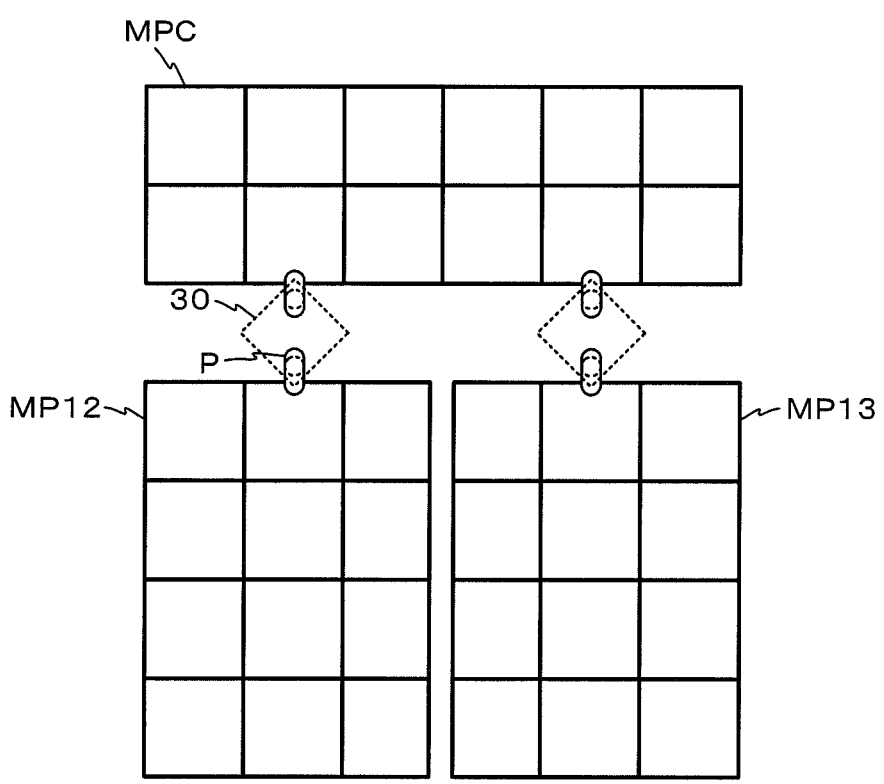
FIG. 31D is a plan view illustrating line patterns.

The mesh patterns illustrated in FIG. 31A and FIG. 31B are also effective to make a gap between the mesh patterns unnoticeable. FIG. 31C illustrates the case where one line pattern is removed from a two-dimensional mesh pattern to produce the two mesh patterns MP12 and MP13, which are electrically isolated to the right and the left. FIG. 31D illustrates the case where the two mesh patterns MP12 and MP13 having opposed sides are disposed close to one another. The above-described structures illustrated in FIG. 31A and FIG. 31B are effective to make the gap between the mesh patterns MP12 and MP13, which are close to one another as illustrated in FIG. 31D, unnoticeable. The gap in the vertical direction between the mesh patterns can be formed into the above-described zigzag slits or formed by partially thinning out the opposed line patterns or by combining these methods.

The first embodiment, the second embodiment, the third embodiment, the fourth embodiment, the fifth embodiment, the sixth embodiment, and the seventh embodiment of the present disclosure are described above. Obviously, these first to seventh embodiments can be mutually combined.

While some embodiments of the present disclosure have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the inventions.

The invention claimed is:

1. A light-emitting module comprising:
   a first insulating film, the first insulating film at least partially light transmissive;
   a plurality of conductor patterns comprising at least a first conductor pattern and a second conductor pattern;
   at least a first light-emitting element, an anode of the first light-emitting element connected to the first conductor pattern and a cathode of the first light-emitting element connected to the second conductor pattern; and
a resin layer that holds the light-emitting element to the first insulating film,
the first conductor pattern comprising a plurality of first conductor pattern conductive lines on the first insulating film,
the second conductor pattern comprising a plurality of second conductor pattern conductive lines on the first insulating film,
a gap between the first conductor pattern and the second conductor pattern, the first conductor pattern and the second conductor pattern adjacent to each other along the gap, in at least a first portion of the gap;
some of the first conductor pattern conductive lines project into the gap and extend more than halfway across the gap, and
some of the second conductor pattern conductive lines project into the gap and extend more than halfway across the gap.

2. The light-emitting module according to claim 1, wherein:
the first conductor pattern conductive lines comprise:
a plurality of first conductive lines, the first conductive lines being parallel to one another; and
a plurality of second conductive lines intersecting with the first conductive lines, the second conductive lines being parallel to one another.

3. The light-emitting module according to claim 2, wherein:
the first conductor pattern conductive lines project into the gap from a first boundary of the gap,
the second conductor pattern conductive lines project into the gap from a second boundary of the gap, and
the first conductor pattern conductive lines that project into the gap from the first boundary of the gap and the second conductor pattern conductive lines that project into the gap from the second boundary of the gap are arranged in alternation along the gap.

4. The light-emitting module according to claim 2, wherein:
the first conductor pattern comprises a first pad to which the anode of the first light-emitting element is connected,
two or more of the first conductor pattern conductive lines are connected to the first pad,
the second conductor pattern comprises a second pad to which the cathode of the first light-emitting element is connected, and
two or more of the second conductor pattern conductive lines are connected to the second pad.

5. The light-emitting module according to claim 2, wherein the light-emitting module further comprises a second insulating film disposed opposed to the first insulating film.

6. The light-emitting module according to claim 5, wherein:
the light-emitting module further comprises a mesh pattern formed on the second insulating film, the mesh pattern being constituted of a plurality of mesh pattern conductive lines, wherein
the first conductive lines and the second conductive lines intersect with the mesh pattern conductive lines.

7. The light-emitting module according to claim 6, wherein the mesh pattern conductive lines include curved lines.

8. The light-emitting module according to claim 6, wherein at least one of the first conductor pattern conductive lines and the second conductor pattern conductive lines are curved lines.

9. The light-emitting module according to claim 1, wherein:
the light-emitting module comprises a plurality of light-emitting elements connected to a control circuit, the control circuit being configured to control the light-emitting elements that are connected to the control circuit, and
the light-emitting elements that are connected to the control circuit are in parallel to one another.

10. The light-emitting module according to claim 9, wherein
ones of the anodes and the cathodes of the respective light-emitting elements are connected to a common conductor pattern.

11. The light-emitting module according to claim 1, wherein:
the light-emitting module comprises a plurality of light-emitting elements disposed on a predetermined curved line, and
the conductor patterns have a fan shape specified by one set of straight lines perpendicular to the curved line.

12. The light-emitting module according to claim 1, wherein:
the light-emitting module comprises a plurality of light-emitting elements disposed on a predetermined curved line, and
the respective conductor patterns are adjacent to one another via a side parallel to a predetermined straight line intersecting with the curved line.

13. The light-emitting module according to claim 1, wherein:
the light-emitting module comprises a plurality of light-emitting elements,
the first conductor pattern conductive lines comprise:
a plurality of first conductive lines, the first conductive lines being parallel to one another;
a plurality of second conductive lines intersecting with the first conductive lines, the second conductive lines being parallel to one another; and
first connecting pads to which the light-emitting elements are connected, and
the first connecting pads are connected to respective first conductive lines and respective second conductive lines.

14. The light-emitting module according to claim 1, wherein:
the first conductor pattern conductive lines comprise curved lines or polygonal shapes.

15. The light-emitting module according to claim 1, wherein the first conductor pattern conductive lines comprise:
a plurality of first conductive lines, the first conductive lines being parallel to one another; and
a plurality of second conductive lines intersecting with the first conductive lines, the second conductive lines being parallel to one another, and
one of the plurality of conductor patterns and a wiring layer with a different height form a multilayer wiring.

16. The light-emitting module according to claim 1, wherein
each of the conductor patterns comprises:
a plurality of first conductive lines, the first conductive lines being parallel to one another; and a plurality of second conductive lines intersecting with the first conductive lines, the second conductive lines being parallel to one another, and the plurality of conductor patterns or a unit of the plurality of conductor patterns and the first insulating film has a transmittance of 75% or more, and the conductor patterns has a sheet resistance of 100Ω or less.

17. The light-emitting module according to claim 16, wherein
the plurality of conductor patterns have the sheet resistance of 70Ω or less.

18. The light-emitting module according to claim 16, wherein
the plurality of conductor patterns have the sheet resistance of 30Ω or less.

19. The light-emitting module according to claim 16, wherein
each of the first conductive lines and the second conductive lines has a line width of 20 μm or less.

20. The light-emitting module according to claim 16, wherein
the first conductive lines have an arrangement pitch of 500 μm or less, and the second conducive lines have an arrangement pitch of 500 μm or less.

21. The light-emitting module according to claim 1, wherein
the plurality of conductor patterns are constituted of fan shapes or sides parallel to a predetermined straight line, the plurality of conductor patterns having a surface formed into a curved surface.

22. The light-emitting module according to claim 1, wherein:
the first pattern conductive lines project into the gap from a first boundary of the gap,
the second pattern conductive lines project into the gap from a second boundary of the gap, and
the gap between the first conductor pattern conductive lines that project from the first boundary of the gap and the second conductor pattern conductive lines that project from the second boundary of the gap is a wave shape.

23. The light-emitting module according to claim 1, wherein:
the first pattern conductive lines project into the gap from a first boundary of the gap,
the second pattern conductive lines project into the gap from a second boundary of the gap, and
the gap between the first conductor pattern conductive lines that project from the first boundary of the gap and the second conductor pattern conductive lines that project from the second boundary of the gap is a zigzag shape.

24. The light-emitting module according to claim 1, wherein a straight line cannot pass between the first conductor pattern conductive lines that project at the first boundary and the second conductor pattern conductive lines that project at the second boundary, and a wave shape can pass between the first conductor pattern conductive lines that project at the first boundary and the second conductor pattern conductive lines that project at the second boundary.

* * * * *